(12) United States Patent
Zhu

(10) Patent No.: US 12,727,160 B2
(45) Date of Patent: Sep. 1, 2026

(54) NOR-TYPE MEMORY DEVICE HAVING DECREASED CHANNEL RESISTANCE, METHOD OF MANUFACTURING NOR-TYPE MEMORY DEVICE, AND ELECTRONIC APPARATUS INCLUDING MEMORY DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 682 days.

(21) Appl. No.: 18/042,754

(22) PCT Filed: Feb. 22, 2022

(86) PCT No.: PCT/CN2022/077239

§ 371 (c)(1),
(2) Date: Feb. 23, 2023

(87) PCT Pub. No.: WO2022/188621

PCT Pub. Date: Sep. 15, 2022

(65) Prior Publication Data

US 2023/0337428 A1 Oct. 19, 2023

(30) Foreign Application Priority Data

Mar. 8, 2021 (CN) ........................ 202110252926.X

(51) Int. Cl.
*H10B 43/27* (2023.01)
*H10B 43/10* (2023.01)
(Continued)

(52) U.S. Cl.
CPC ............. *H10B 43/27* (2023.02); *H10B 43/10* (2023.02); *H10B 51/10* (2023.02); *H10B 51/20* (2023.02); *H10W 20/42* (2026.01); *H10W 20/435* (2026.01)

(58) Field of Classification Search
CPC ........... H10B 41/00–70; G11C 16/0408–0458; G11C 16/0483; G11C 11/5621–5642; G11C 2216/06–10; H10D 30/6891–6894
See application file for complete search history.

(56) References Cited

U.S. PATENT DOCUMENTS

| | | | | |
|---|---|---|---|---|
| 10,121,554 | B2 | 11/2018 | Harari | |
| 2005/0082599 | A1* | 4/2005 | Forbes | H10D 30/685 257/E27.103 |

(Continued)

FOREIGN PATENT DOCUMENTS

| | | | |
|---|---|---|---|
| CN | 106298792 | A | 1/2017 |
| CN | 108140415 | A | 6/2018 |

(Continued)

OTHER PUBLICATIONS

International Search Report and Written Opinion dated Apr. 28, 2022, for corresponding PCT Application No. PCT/CN2022/077239.

(Continued)

*Primary Examiner* — William B Partridge
*Assistant Examiner* — Gustavo G Ramallo
(74) *Attorney, Agent, or Firm* — Kinney & Lange, P.A.

(57) ABSTRACT

Disclosed are a NOR-type memory device, a method of manufacturing the NOR-type memory device, and an electronic apparatus. The NOR-type memory device may include: a plurality of device layers stacked on a substrate, wherein each device layer includes a first source/drain region and a second source/drain region at opposite ends of (Continued)

the device layer in a vertical direction, and a channel region between the first and second source/drain region; and a gate stack that extends vertically with respect to the substrate to pass through each device layer. The gate stack includes a gate conductor layer and a memory functional layer between the gate conductor layer and the device layer. A memory cell is defined at an intersection of the gate stack and the device layer. A doping concentration in each of the first and second source/drain regions decreases towards the channel region in the vertical direction.

44 Claims, 15 Drawing Sheets

(51) Int. Cl.

| | |
|---|---|
| ***H10B 51/10*** | (2023.01) |
| ***H10B 51/20*** | (2023.01) |
| ***H10W 20/41*** | (2026.01) |
| ***H10W 20/42*** | (2026.01) |

(56) References Cited

U.S. PATENT DOCUMENTS

| | | | | |
|---|---|---|---|---|
| 2015/0179660 | A1* | 6/2015 | Yada | H10D 64/035 257/314 |
| 2020/0051605 | A1 | 2/2020 | Oh | |
| 2020/0098779 | A1 | 3/2020 | Cernea et al. | |
| 2020/0258903 | A1 | 8/2020 | Harari et al. | |
| 2021/0050360 | A1* | 2/2021 | Kai | G11C 5/063 |

FOREIGN PATENT DOCUMENTS

| | | | |
|---|---|---|---|
| CN | 109215696 | A | 1/2019 |
| CN | 111033625 | A | 4/2020 |
| CN | 112909010 | A | 6/2021 |
| CN | 113707667 | A | 11/2021 |

OTHER PUBLICATIONS

Extended European Search Report dated Jan. 31, 2025, for corresponding European Patent Application No. 22766147.7, 12, pgs.

* cited by examiner

B B'

A A'

1017

Device region Contact region

NOR-TYPE MEMORY DEVICE HAVING DECREASED CHANNEL RESISTANCE, METHOD OF MANUFACTURING NOR-TYPE MEMORY DEVICE, AND ELECTRONIC APPARATUS INCLUDING MEMORY DEVICE

CROSS REFERENCE TO RELATED APPLICATION(S)

This application is a Section 371 National Stage Application of International Application No. PCT/CN2022/077239, filed on Feb. 22, 2022, which claims priority to Chinese Patent Application No. 202110252926.X, filed on Mar. 8, 2021 and entitled "NOR-type memory device, method of manufacturing NOR-type memory device, and electronic apparatus including memory device", the entire content of which is incorporated herein in its entirety by reference.

TECHNICAL FIELD

The present disclosure relates to the field of semiconductors, and more particularly, to a NOR-type memory device, a method of manufacturing the NOR-type memory device, and an electronic apparatus including the memory device.

BACKGROUND

In a planar device such as a Metal Oxide Semiconductor Field Effect Transistor (MOSFET), a source, a gate and a drain are arranged in a direction substantially parallel to a substrate surface. Due to such an arrangement, the planar device is difficult to be further scaled down. In contrast, in a vertical device, a source, a gate and a drain are arranged in a direction substantially perpendicular to a substrate surface. As a result, the vertical device is easier to be scaled down compared to the planar device.

Vertical devices may be stacked to increase the integration density. However, this may lead to poor performance. Because in order to stack a plurality of devices conveniently, polycrystalline silicon is usually used as a channel material, resulting in a greater resistance compared with using monocrystalline silicon as the channel material. In addition, it is also desired to adjust a doping level in a source/drain region and a channel independently.

SUMMARY

In view of the above, the present disclosure aims to provide, among others, a NOR-type memory device with an improved performance, a method of manufacturing the NOR-type memory device, and an electronic apparatus including the memory device.

According to an aspect of the present disclosure, there is provided a vertical memory device, including: a plurality of device layers stacked on a substrate, wherein each of the plurality of device layers includes a first source/drain region and a second source/drain region at opposite ends of the device layer in a vertical direction, and a channel region between the first source/drain region and the second source/drain region in the vertical direction; and a gate stack that extends vertically with respect to the substrate to pass through each of the plurality of device layers, wherein the gate stack includes a gate conductor layer and a memory functional layer disposed between the gate conductor layer and the device layer, and a memory cell is defined at an intersection of the gate stack and the device layer, wherein a doping concentration in the first source/drain region decreases towards the channel region in the vertical direction, and a doping concentration in the second source/drain region decreases towards the channel region in the vertical direction.

According to another aspect of the present disclosure, there is provided a vertical memory device, including: a plurality of device layers stacked on a substrate, wherein each of the plurality of device layers includes a first source/drain region and a second source/drain region at opposite ends of the device layer in a vertical direction, and a channel region between the first source/drain region and the second source/drain region in the vertical direction; and a gate stack that extends vertically with respect to the substrate to pass through each of the plurality of device layers, wherein the gate stack includes a gate conductor layer and a memory functional layer disposed between the gate conductor layer and the device layer, and a memory cell is defined at an intersection of the gate stack and the device layer, wherein the NOR-type memory device further includes an interface layer between the first source/drain region and the channel region, and an interface layer between the second source/drain region and the channel region.

According to another aspect of the present disclosure, there is provided a method of manufacturing a vertical memory device, including: alternately disposing a plurality of device layers and a plurality of solid phase dopant source layers on a substrate, so that each of the plurality of device layers is located between the solid phase dopant source layers in a vertical direction, wherein the solid phase dopant source layer contains a dopant; forming a processing channel that extends vertically with respect to the substrate to pass through each of the plurality of device layers; driving the dopant from the solid phase dopant source layer into opposite ends of the device layer by annealing; and forming a gate stack in the processing channel, wherein the gate stack includes a gate conductor layer and a memory functional layer disposed between the gate conductor layer and the device layer, and a memory cell is defined at an intersection of the gate stack and the device layer.

According to another aspect of the present disclosure, there is provided an electronic apparatus including the NOR-type memory device described above.

According to embodiments of the present disclosure, a stack of single crystal material may be used as a building block to build a three-dimensional (3D) NOR-type memory device. Therefore, when a plurality of memory cells are stacked, an increase of resistance may be suppressed. In addition, a solid phase dopant source layer may be used for source/drain doping through diffusion, which helps to form a steep high source/drain doping.

BRIEF DESCRIPTION OF THE DRAWINGS

The above and other objects, features, and advantages of the present disclosure will become more apparent from following descriptions on embodiments thereof with reference to attached drawings, in which:

FIGS. 1, 2(*b*), 3 to 6, 7(*b*), 8(*a*), 9(*a*), 10(*a*), 11(*b*), 12(*b*), and 16 to 19 are cross-sectional views taken along line AA';

FIGS. 7(*c*), 8(*b*), 9(*b*), 10(*b*), 11(*c*), and 13 to 15 are cross-sectional views taken along line BB'.

Throughout the drawings, the same or similar reference numbers denote the same or similar elements.

DETAILED DESCRIPTION OF EMBODIMENTS

Figures 1, 2A:
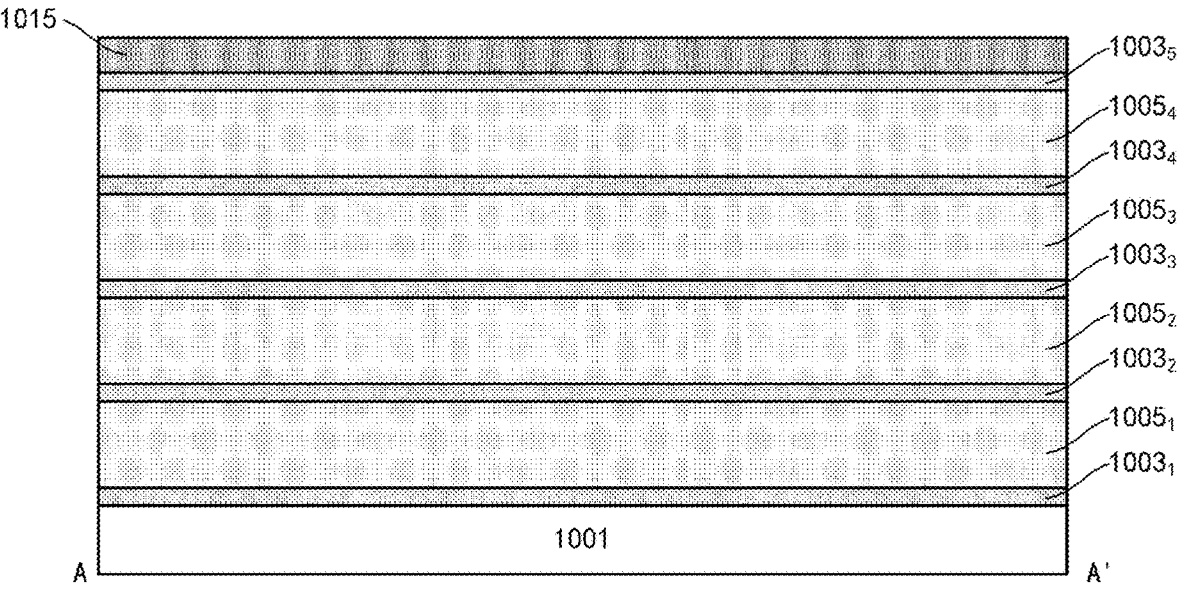
FIGS. 1 to 11(*c*) are schematic diagrams showing some stages in a process of manufacturing a NOR-type memory device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art may also devise regions/layers of other different shapes, sizes, and relative positions as desired in practice.

In the context of the present disclosure, when a layer/element is recited as being "on" a further layer/element, the layer/element may be disposed directly on the further layer/element, or otherwise there may be an intervening layer/element interposed therebetween. Further, if a layer/element is "on" a further layer/element in an orientation, then the layer/element may be "under" the further layer/element when the orientation is turned.

A memory device according to an embodiment of the present disclosure is based on a vertical device. The vertical device may include an active region arranged on a substrate in a vertical direction (a direction substantially perpendicular to a surface of the substrate). The active region includes source/drain regions at upper and lower ends of the active region and a channel region between the source/drain regions. A conductive channel may be formed between the source/drain regions through the channel region. In the active region, the source/drain regions and the channel region may be defined by, for example, a doping concentration.

According to an embodiment of the present disclosure, the active region may be defined by a device layer on the substrate. For example, the device layer may be a stack of semiconductor material, the source/drain regions may be respectively formed at opposite ends of the stack in the vertical direction, and the channel region may be formed in a middle portion of the stack in the vertical direction. Alternatively, another semiconductor layer may be grown on a sidewall of the stack (also known as a "base layer"), the source/drain regions may be respectively formed at opposite ends of the semiconductor layer in the vertical direction, and the channel region may be formed in a middle portion of the semiconductor layer in the vertical direction. A gate stack may extend through the device layer, so that the active region may surround a periphery of the gate stack. Here, the gate stack may include a memory functional layer, such as at least one of a charge trapping material or a ferroelectric material, so as to achieve a memory function. In this way, the gate stack is cooperated with an active region opposite to the gate stack, so as to define a memory cell. Here, the memory cell may be a flash memory cell.

A plurality of gate stacks may be arranged to pass through the device layer, so as to define a plurality of memory cells at intersections of the plurality of gate stacks and the device layer. In a plane where the device layer is located, these memory cells are arranged into an array (for example, generally, a two-dimensional array arranged in rows and columns) corresponding to the plurality of gate stacks.

Since the vertical device is easy to be stacked, the memory device according to an embodiment of the present disclosure may be a three-dimensional (3D) array. Specifically, a plurality of such device layers may be arranged in the vertical direction. The gate stack may extend vertically to pass through the plurality of device layers. In this way, for a single gate stack, it intersects the plurality of device layers stacked in the vertical direction to define a plurality of memory cells stacked in the vertical direction.

In a NOR (NOT OR)-type memory device, each memory cell may be connected to a common source line. In view of such configuration, every two adjacent memory cells in the vertical direction may share a same source line connection, so as to save wirings. For example, each of the two adjacent memory cells may have a near end (i.e., an end close to the other of the two memory cells) and a far end (i.e., an end away from the other of the two memory cells). The source/drain region at the near end of each of the two adjacent memory cells may be used as a source region, and thus is electrically connected to the source line, for example, through a common contact portion. The source/drain regions at the far end of each of the two adjacent memory cells 1 may be used as a drain region, and the two adjacent memory cells may have their source/drain regions at the far ends being connected to different bit lines respectively.

The device layer may be formed by epitaxial growth and may be a single crystal semiconductor material. Compared with a conventional process of forming a plurality of gate stacks stacked on each other and then forming a vertical active region which passes through these gate stacks, it is easier to form an active region (especially the channel region) of single crystal in the present disclosure.

The device layer may be doped in situ during growth, and a doping characteristic in the channel region may be defined. In addition, a doping of the source/drain region may be achieved by diffusion. For example, a solid phase dopant source layer (also used as an isolation layer between memory cells) may be provided at each of the opposite ends of each device layer, and a dopant in the solid phase dopant source layer may be driven into the device layer (for example, the above-mentioned stack or the semiconductor layer grown on the sidewall of the stack), so as to form the source/drain region. Accordingly, a doping distribution of the source/drain region and a doping distribution of the channel region may be adjusted separately, and a steep high source/drain doping may be formed.

When the source/drain region and the channel region are formed in the above-mentioned stack, the stack may be considered as a bulk material, and thus the channel region is formed in the bulk material. In this case, the process is relatively simple. In addition, when the channel region is formed in the semiconductor layer, the semiconductor layer may be formed as a nanosheet or a nanowire, and thus the channel region is formed in the nanosheet or the nanowire (the memory cell becomes a nanosheet or nanowire device). In this case, good control of a short channel effect may be achieved. In addition, as described below, a SSRW (Super Steep Retrograded Well) may further be formed in the semiconductor layer, which helps to control the short channel effect.

Such vertical memory device may be manufactured as follows. Specifically, a plurality of device layers and a plurality of solid phase dopant source layers may be alternately arranged on the substrate, so that each device layer is located between solid phase dopant source layers in the vertical direction, wherein the solid phase dopant source layer contains a dopant. The device layer may be provided by epitaxial growth. During epitaxial growth, a position of the solid phase dopant source layer may be defined by a sacrificial layer. The sacrificial layer may then be replaced by the solid phase dopant source layer. In addition, in situ doping may be performed during epitaxial growth, so as to achieve a desired doping polarity and doping concentration.

A processing channel, which extends vertically with respect to the substrate to pass through each device layer, may be formed. In the processing channel, a sidewall of the sacrificial layer may be exposed, so that the sacrificial layer may be replaced by the solid phase dopant source layer. A gate stack may be formed in the processing channel. In addition, the dopant may be driven from the isolation layer to opposite ends of the device layer by annealing, so as to form the source/drain regions. The solid phase dopant source layer may be replaced by an isolation layer.

The present disclosure may be presented in various forms, and some examples of which will be described below. In the following description, the selection of various materials is involved. In selecting the materials, etching selectivity is considered in addition to the function of the material (for example, a semiconductor material is used to form the active region, a dielectric material is used to form an electrical isolation, and a conductive material is used to form an electrode, an interconnection structure, etc.). In the following description, the required etching selectivity may or may not be indicated. It should be clear to those skilled in the art that when etching a certain material layer is mentioned below, if it is not mentioned that other layers are also etched or the drawing does not show that other layers are also etched, then this etching may be selective, and the material layer may have etching selectivity with respect to other layers exposed to a same etching recipe.

FIGS. 1 to 11(*c*) are schematic diagrams showing some stages in a process of manufacturing a NOR-type memory device according to an embodiment of the present disclosure.

As shown in FIG. 1, a substrate 1001 is provided. The substrate 1001 may be a substrate in any form, for example, but not limited to, a bulk semiconductor material substrate such as a bulk silicon (Si) substrate, a Semiconductor On Insulator (SOI) substrate, a compound semiconductor substrate such as an SiGe substrate, or the like. Hereinafter, the bulk Si substrate, such as a Si wafer, will be described by way of example for the convenience of description.

On the substrate 1001, a memory device, such as a NOR-type flash memory, may be formed as described below. A memory cell in the memory device may be an n-type device or a p-type device. Here, an n-type memory cell is described as an example. For this purpose, a p-type well may be formed in the substrate 1001. Therefore, the following description, in particular the description of a doping type, is for forming of the n-type device. However, the present disclosure is not limited thereto.

On the substrate 1001, a sacrificial layer $\mathbf{1003}_1$ used to define the isolation layer and a device layer $\mathbf{1005}_1$ used to define an active region of the memory cell may be formed by, for example, epitaxial growth.

Each layer grown on the substrate 1001 may be a single crystal semiconductor layer. These layers may have a crystal interface or a doping concentration interface between each other because they are grown or doped separately.

The sacrificial layer $\mathbf{1003}_1$ may then be replaced by an isolation layer used to isolate the device from the substrate. A thickness of the sacrificial layer $\mathbf{1003}_1$ may correspond to a thickness of the isolation layer that is desired to be formed, for example, about 10 nm to 50 nm. According to a circuit design, the sacrificial layer $\mathbf{1003}_1$ may be omitted. The device layer $\mathbf{1005}_1$ may then define the active region of the memory cell, and may have a thickness of about 40 nm to 200 nm.

These semiconductor layers may include various suitable semiconductor materials, for example, an element semiconductor material such as Si or Ge, a compound semiconductor material such as SiGe, etc. Considering the following process of replacing the sacrificial layer $\mathbf{1003}_1$ by the isolation layer, the sacrificial layer $\mathbf{1003}_1$ may have etching selectivity with respect to the device layer $\mathbf{1005}_1$. For example, the sacrificial layer $\mathbf{1003}_1$ may include SiGe (an atomic percentage of Ge, for example, is about 15% to 30%), and the device layer $\mathbf{1005}_1$ may include Si.

The device layer $\mathbf{1005}_1$ may be doped in situ when growing. For example, for the n-type device, a p-type doping may be performed, and a doping concentration may be, for example, about 1E17 $cm^{-3}$ to 1E19 $cm^{-3}$. Such doping may define a doping characteristic in the subsequently formed channel region, so as to adjust a threshold voltage ($V_t$) of the device, control the short channel effect, and the like. Here, the doping concentration may have a non-uniform distribution in the vertical direction, so as to optimize the device performance. For example, a concentration in a region close to the drain region (subsequently connected to the bit line) is relatively high to reduce the short channel effect, while a concentration in a region close to the source region (subsequently connected to the source line) is relatively low to reduce the channel resistance. This may be achieved by introducing different dosages of the dopant at different phases of growth.

In order to increase an integration density, a plurality of device layers may be provided. For example, device layers $\mathbf{1005}_2$, $\mathbf{1005}_3$, and $\mathbf{1005}_4$ may be provided on the device layer $\mathbf{1005}_1$ by epitaxial growth. The device layers are separated from each other by sacrificial layers $\mathbf{1003}_2$, $\mathbf{1003}_3$, and $\mathbf{1003}_4$ used to define the isolation layer. Although only four device layers are shown in FIG. 1, the present disclosure is not limited thereto. According to the circuit design, it is possible to omit the isolation layer between certain device layers. The device layers $\mathbf{1005}_2$, $\mathbf{1005}_3$, and $\mathbf{1005}_4$ may have a same or similar thickness and/or material as a thickness and/or material of the device layer 1005$_1$, or may have different thicknesses and/or materials from the thickness and/or material of the device layer 1005$_1$. Here, for convenience of description only, it is assumed that the device layers have the same configuration.

On such layers formed on the substrate 1001, a hard mask layer 1015 may be provided to facilitate patterning. For example, the hard mask layer 1015 may include nitride (for example, silicon nitride). A thickness of the hard mask layer 1015 is about 50 nm to 200 nm.

It is also possible to provide a sacrificial layer 1003$_5$, which is used to define the isolation layer, between the hard mask layer 1015 and the device layer 1005$_4$. For sacrificial layers 1003$_2$ to 1003$_5$, reference may be made to the above description of the sacrificial layer 1003$_1$.

In the following, on the one hand, a processing channel which may reach the sacrificial layer is desired, so as to replace the sacrificial layer by the isolation layer. On the other hand, it is desired to define a region used to form a gate. According to an embodiment of the present disclosure, the two aspects may be implemented in combination. Specifically, a gate region may be defined by the processing channel.

Figure 2B:
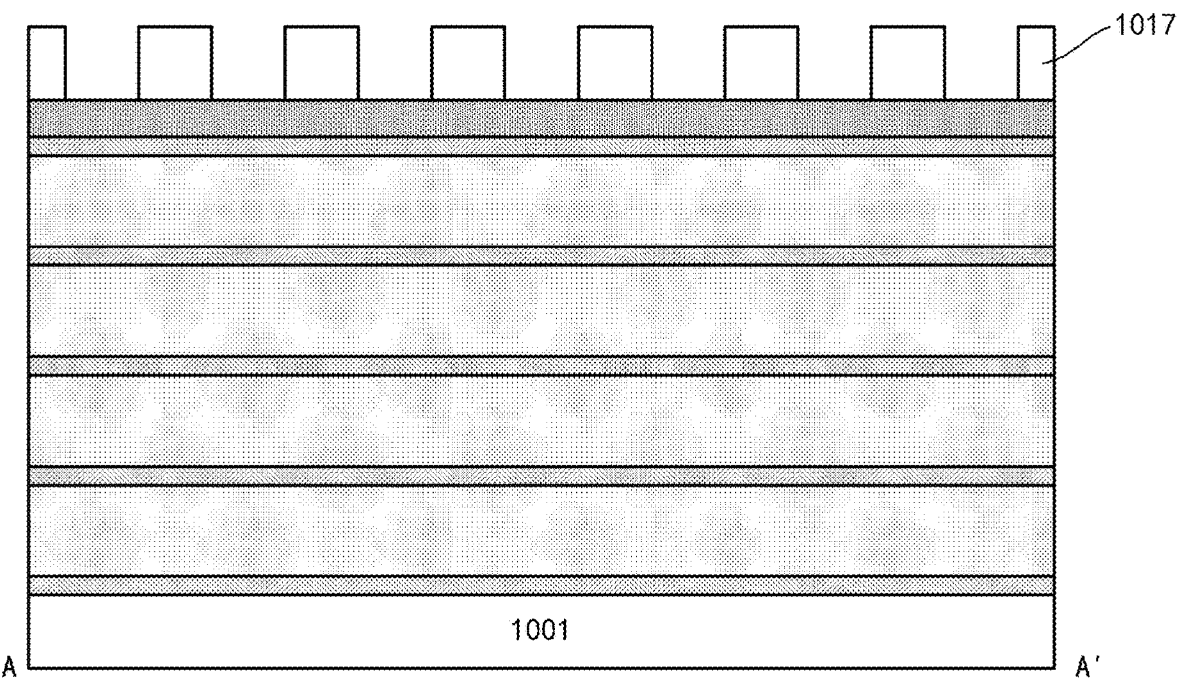

For example, as shown in FIGS. 2(*a*) and 2(*b*), a photoresist 1017 may be formed on the hard mask layer 1015. The photoresist 1017 may be patterned to have a plurality of openings by photolithography, and these openings may define positions of the processing channels. The opening may have various suitable shapes, such as round, rectangular, square, polygon, etc. and has a suitable size, such as a diameter or side length of about 20 nm to 500 nm. Here, these openings (especially openings in the device region) may be arranged in form of an array, such as a two-dimensional array along horizontal and vertical directions in paper in FIG. 2(*a*). The array may then define an array of memory cells. Although the openings are shown to be formed on the substrate (including the device region where the memory cell will be fabricated subsequently and the contact region where a contact portion will be fabricated subsequently) with a basically consistent size and a substantially uniform density in FIG. 2(*a*), the present disclosure is not limited thereto. The size and/or density of the openings may be changed. For example, a density of the openings in the contact region may be less than a density of the openings in the device region, so as to reduce the resistance in the contact region.

Figure 3:
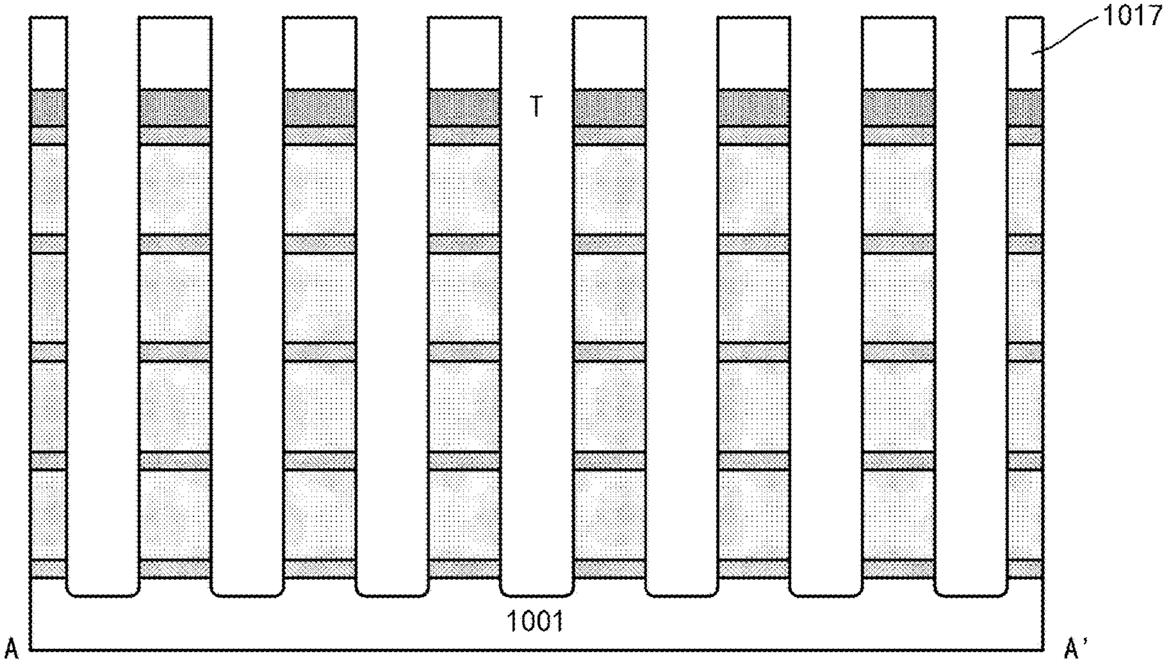

As shown in FIG. 3, the patterned photoresist 1017 may be used as an etching mask to etch each layer on the substrate 1001 by anisotropic etching, such as reactive ion etching (RIE), so as to form a processing channel T. RIE may be performed in a substantially vertical direction (for example, a direction perpendicular to the substrate surface) and may be performed into the substrate 1001. Accordingly, a plurality of vertical processing channels T are left on the substrate 1001. A processing channel T in the device region also defines the gate region. Then, the photoresist 1017 may be removed.

Currently, the sidewall of the sacrificial layer is exposed in the processing channel T. Accordingly, the sacrificial layer may be replaced by the isolation layer via the exposed sidewall. Considering a function of supporting the device layers 1005$_1$ to 1005$_4$ during replacement, a support layer may be formed.

Figure 4:
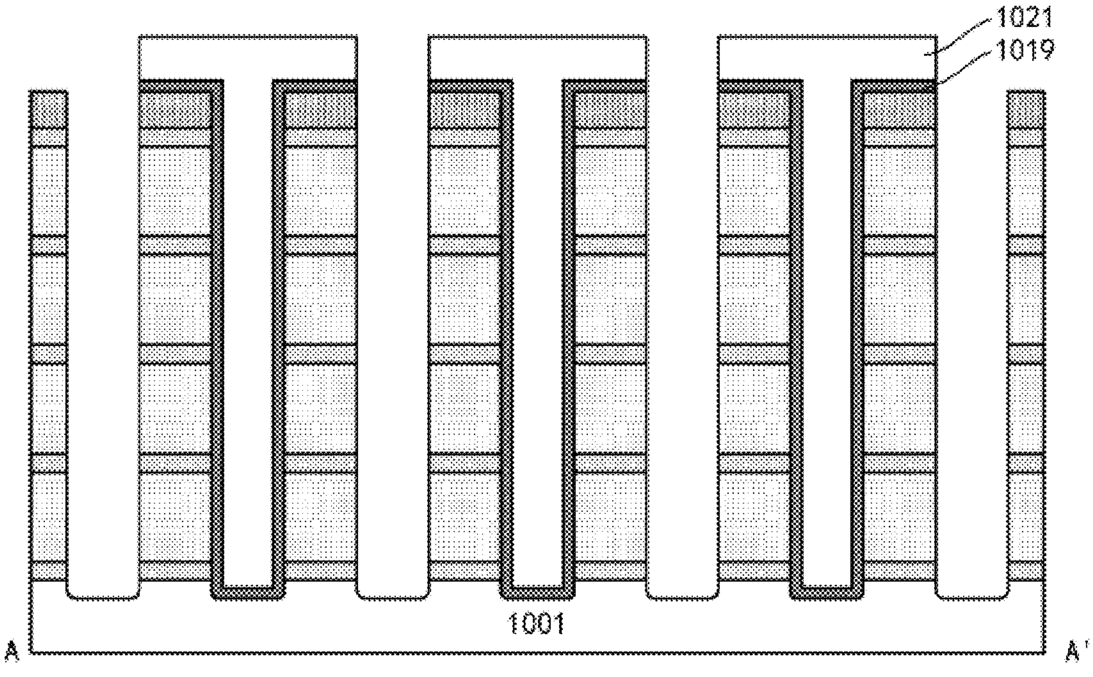

For example, as shown in FIG. 4, a support material layer may be formed on the substrate 1001 by, for example, deposition, such as chemical vapor deposition (CVD). The support material layer may be formed in a substantially conformal manner. Considering the etching selectivity, especially the etching selectivity with respect to the hard mask layer 1015 (nitride in this example) and the subsequently formed isolation layer (oxide in this example), the support material layer may include, for example, SiC. By forming a photoresist 1021 and performing selective etching such as RIE with the photoresist 1021, a part of the support material layer in one or more of processing channels T may be removed while a part of the support material layer in the rest of processing channels T may be retained. The remaining part of the support material layer forms a support layer 1019. In this way, on the one hand, the sacrificial layer may be replaced via a processing channel in which the support layer 1019 is not formed, and on the other hand, the device layers 1005$_1$ to 1005$_4$ may be supported by the support layer 1019 in the rest of processing channels. After that, the photoresist 1021 may be removed.

An arrangement of the processing channel in which the support layer 1019 is formed and the processing channel in which the support layer 1019 is not formed may be achieved by a pattern of the photoresist 1021. In addition, the processing channel in which the support layer 1019 is formed and the processing channel in which the support layer 1019 is not formed may be substantially evenly distributed for process consistency and uniformity. As shown in FIG. 4, the processing channel in which the support layer 1019 is formed and the processing channel in which the support layer 1019 is not formed may be arranged alternately.

Figure 5:
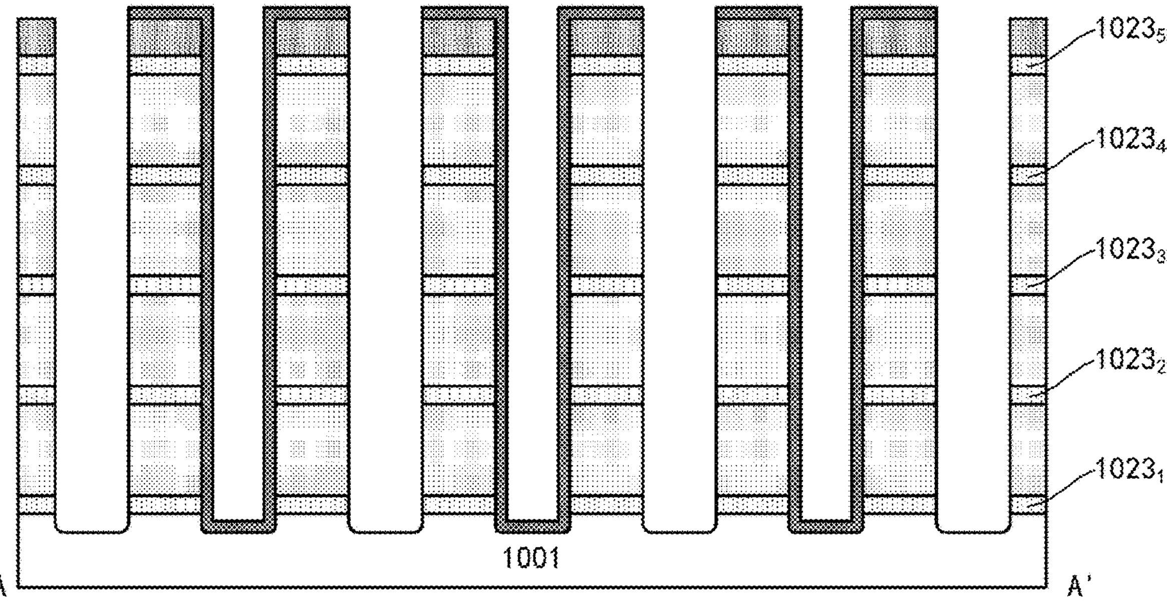

Next, as shown in FIG. 5, the sacrificial layers 1003$_1$ to 1003$_5$ may be removed by selective etching via the processing channel T. Due to the existence of the support layer 1019, the device layers 1005$_1$ to 1005$_4$ may be kept from collapsing. Gaps left by the removal of the sacrificial layers may be filled with a dielectric material to form isolation layers 1023$_1$, 1023$_2$, 1023$_3$, 1023$_4$, and 1023$_5$ by a process of e.g. depositing (preferably atomic layer deposition (ALD) to better control a film thickness) and then etching back (for example, RIE in the vertical direction).

According to an embodiment of the present disclosure, the isolation layers 1023$_1$ to 1023$_5$ may contain a dopant (an n-type dopant for an n-type memory cell, and a p-type dopant for a p-type memory cell), so as to achieve source/drain doping. Accordingly, the isolation layers 1023$_1$ to 1023$_5$ may become solid phase dopant source layers. For example, the isolation layers 1023$_1$ to 1023$_5$ may include a phosphosilicate glass (PSG) with a phosphorus (P) content of about 0.1% to 10% (for the n-type memory cell), or a borosilicate glass (BSG) with a boron (B) content of about 0.1% to 10% (for the p-type memory cell).

In this example, the source/drain doping is achieved by the solid phase dopant source layer rather than in situ doping, which may achieve steep high source/drain doping and inhibit cross contamination caused by in situ growth during epitaxial growth.

Next, the support layer 1019 may be removed by selective etching.

The gate stack may be formed in the processing channel, especially in the processing channel of the device region. Here, a memory function may be achieved by the gate stack for forming the memory device. For example, the gate stack may include a memory structure, such as a charge trapping material or a ferroelectric material.

Figure 6:
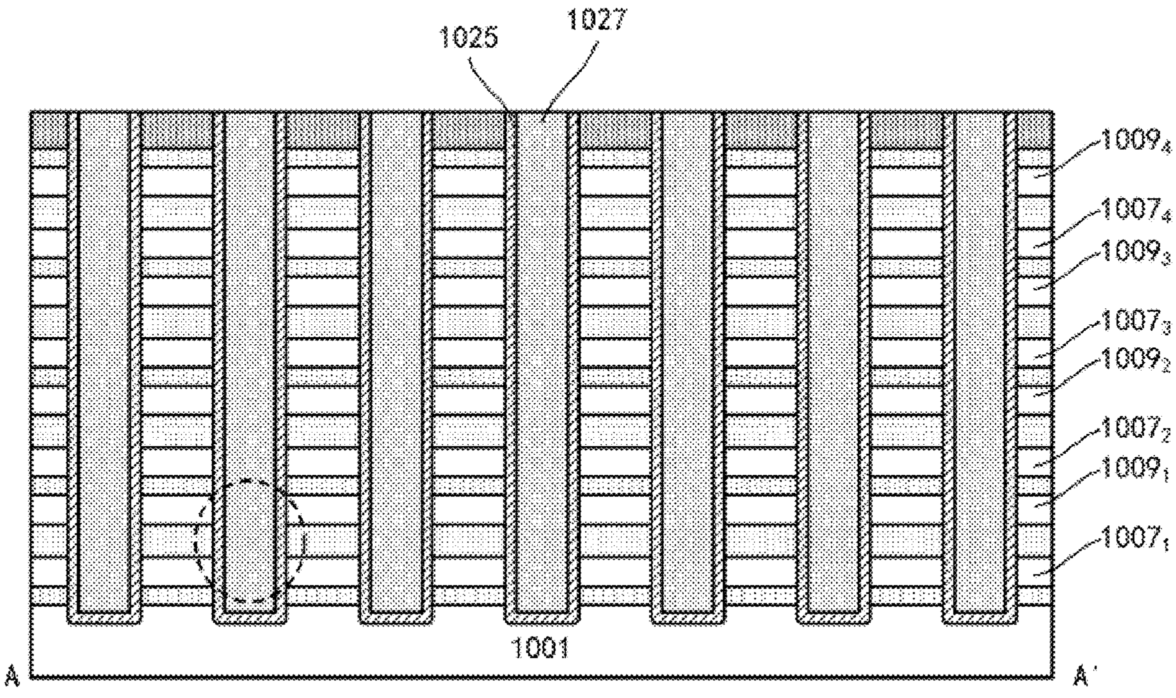

As shown in FIG. 6, a memory functional layer 1025 and a gate conductor layer 1027 may be formed sequentially by, for example, deposition. The memory functional layer 1025 may be formed in a substantially conformal manner. A gap left after the memory functional layer 1025 is formed in the processing channel T may be filled with the gate conductor layer 1027. A planarization treatment, such as chemical mechanical polishing (CMP, for example, CMP may stop at the hard mask layer 1015), may be performed on the formed gate conductor layer 1027 and the formed memory function layer 1025, so that the gate conductor layer 1027 and the memory functional layer 1025 may be left in the processing channel T to form the gate stack.

The memory functional layer 1025 may be based on a dielectric charge trapping, a ferroelectric material effect or a bandgap engineering charge memory (SONOS), etc. For example, the memory functional layer 1025 may include a dielectric tunneling layer (such as an oxide with a thickness of bout 1 nm to 5 nm, which may be formed by oxidation or ALD), an energy band offset layer (such as a nitride with a thickness of about 2 nm to 10 nm, which may be formed by CVD or ALD), and an isolation layer (such as an oxide with a thickness of about 2 nm to 6 nm, which may be formed by oxidation, CVD or ALD). Such three-layer structure may lead to an energy band structure that traps electrons or holes. Alternatively, the memory functional layer 1025 may include a ferroelectric material layer, such as $HfZrO_2$ with a thickness of about 2 nm to 20 nm.

The gate conductor layer 1027 may include, for example, (doped, such as p-doped in the case of the n-type device) polysilicon or a metal gate material.

Annealing treatment may be performed to drive the dopant in the solid phase dopant source layer into the device layer. For each of the device layers $\mathbf{1005}_1$ to $\mathbf{1005}_4$, dopants in isolation layers at upper and lower ends of each device layer enter each device layer from the upper and lower ends of each device layer respectively, so that highly doped regions $\mathbf{1007}_1$ and $\mathbf{1009}_1$, $\mathbf{1007}_2$ and $\mathbf{1009}_2$, $\mathbf{1007}_3$ and $\mathbf{1009}_3$, and $\mathbf{1007}_4$ and $\mathbf{1009}_4$ (for example, n-type doping of about 1E19 $cm^{-3}$ to 1E21 $cm^{-3}$), may be formed at the upper and lower ends of each of the device layers $\mathbf{1005}_1$ to $\mathbf{1005}_4$, so as to define the source/drain regions. Here, a diffusion depth of the dopant from the isolation layer to the device layer may be controlled (for example, to be about 10 nm to 50 nm), so that a middle portion of each device layer in the vertical direction may keep to have a relatively low doping, for example to have the doping polarity (for example, p-type doping) and doping concentration (for example, 1E17 $cm^{-3}$ to 1E19 $cm^{-3}$) caused by the in situ doping during growth, and may define the channel region.

The doping concentration achievable by in situ doping is generally lower than 1E20 $cm^{-3}$. According to an embodiment of the present disclosure, the source/drain doping is performed by diffusion from the solid phase dopant source layer. This may achieve high doping, for example, the highest doping concentration may be higher than 1E20 $cm^{-3}$, or even up to about 7E20 $cm^{-3}$ to 3E21 $cm^{-3}$. In addition, due to the diffusion characteristics, the source/drain region may have a doping concentration gradient that decreases, in the vertical direction, from a side of the source/drain region close to the solid dopant source layer to a side of the source/drain region close to the channel region.

Such diffusion doping may achieve a steep doping concentration distribution. For example, there may be a sharp change in doping concentration between the source/drain region and the channel region, e.g. less than about 5 nm/dec to 20 nm/dec (that is, a decrease of the doping concentration by at least one order of magnitude occurs in a range less than about 5 nm to 20 mm). The region having such sharp change in the vertical direction may be called an "interface layer".

Since the diffusion from each isolation layer into the device layer has substantially the same diffusion characteristic, each of the source/drain regions $\mathbf{1007}_1$, $\mathbf{1009}_1$, $\mathbf{1007}_2$, $\mathbf{1009}_2$, $\mathbf{1007}_3$, $\mathbf{1009}_3$, $\mathbf{1007}_4$ and $\mathbf{1009}_4$ may be substantially coplanar in a transverse direction. Similarly, each channel region may be substantially coplanar in the transverse direction. In addition, as described above, the channel region may have a non-uniform distribution in the vertical direction. The doping concentration in a region of the channel region close to the source/drain region (drain region) on one side of the channel region is relatively high, while the doping concentration in a region of the channel region close to the source/drain region (source region) on the other side of the channel region is a relatively low.

As shown in FIG. 6, the gate stack (1025/1027) having the memory functional layer is surrounded by the device layer. The gate stack is cooperated with the device layer to define the memory cell, as shown in a dotted circle in FIG. 6. The channel region may be connected to source/drain regions at opposite sides of the channel region, and the channel region may be controlled by the gate stack. One of source/drain regions at upper and lower ends of a single memory cell is used as the source region and may be electrically connected to the source line. The other one of the source/drain regions at the upper and lower ends of the single memory cell is used as the drain region and may be electrically connected to the bit line. For every two adjacent memory cells in the vertical direction, a source/drain region at an upper end of the lower one of the two memory cells and a source/drain region at a lower end of the upper one of the two memory cells may be used as source regions, and thus may share the same source line connection.

The gate stack extends in a column shape in the vertical direction and intersects with a plurality of device layers, so as to define a plurality of memory cells stacked on each other in the vertical direction. Memory cells associated with a single gate stack column may form a memory cell string. Corresponding to an arrangement of the gate stack columns (corresponding to the above arrangement of the processing channels T, such as the two-dimensional array), a plurality of such memory cell strings are arranged on the substrate, so as to form a three-dimensional (3D) array of memory cells.

In this way, the fabrication of the memory cell (in the device region) is completed. Then, various electrical contact portions may be fabricated (in the contact region) to achieve a desired electrical connection.

In order to achieve an electrical connection to each device layer, a step structure may be formed in the contact region. Such step structure may be formed in various manners in the art. According to an embodiment of the present disclosure, the step structure may be formed as follows, for example.

Figure 7A:
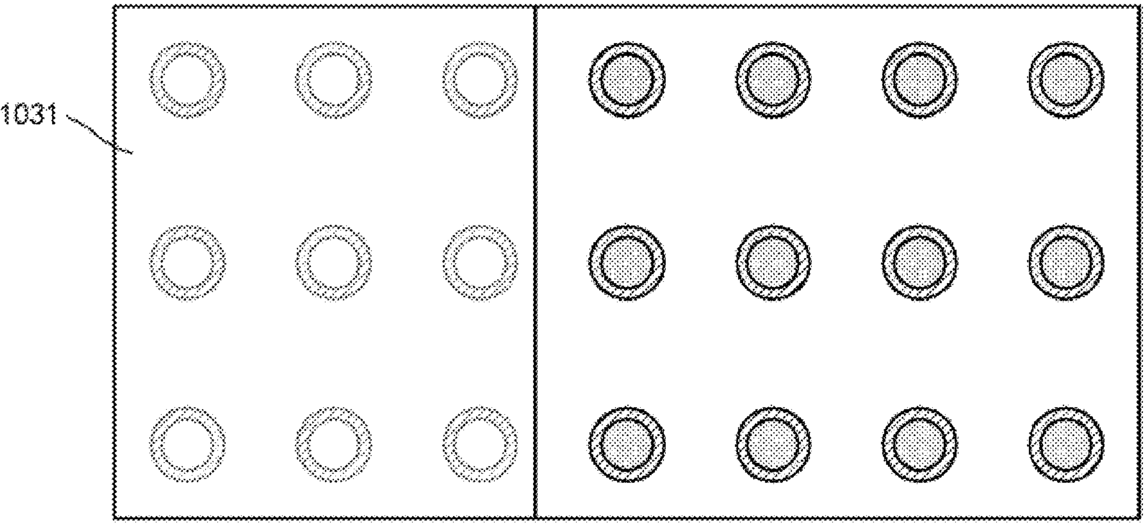
Figure 7B:
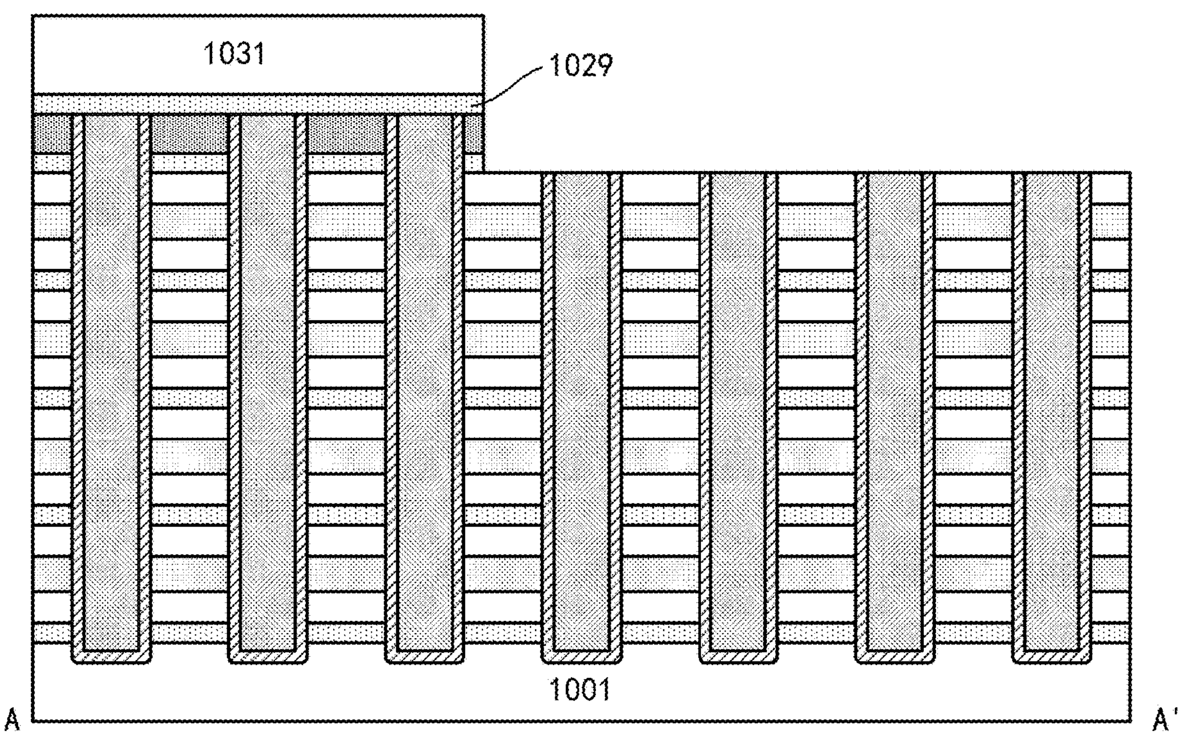
Figure 7C:
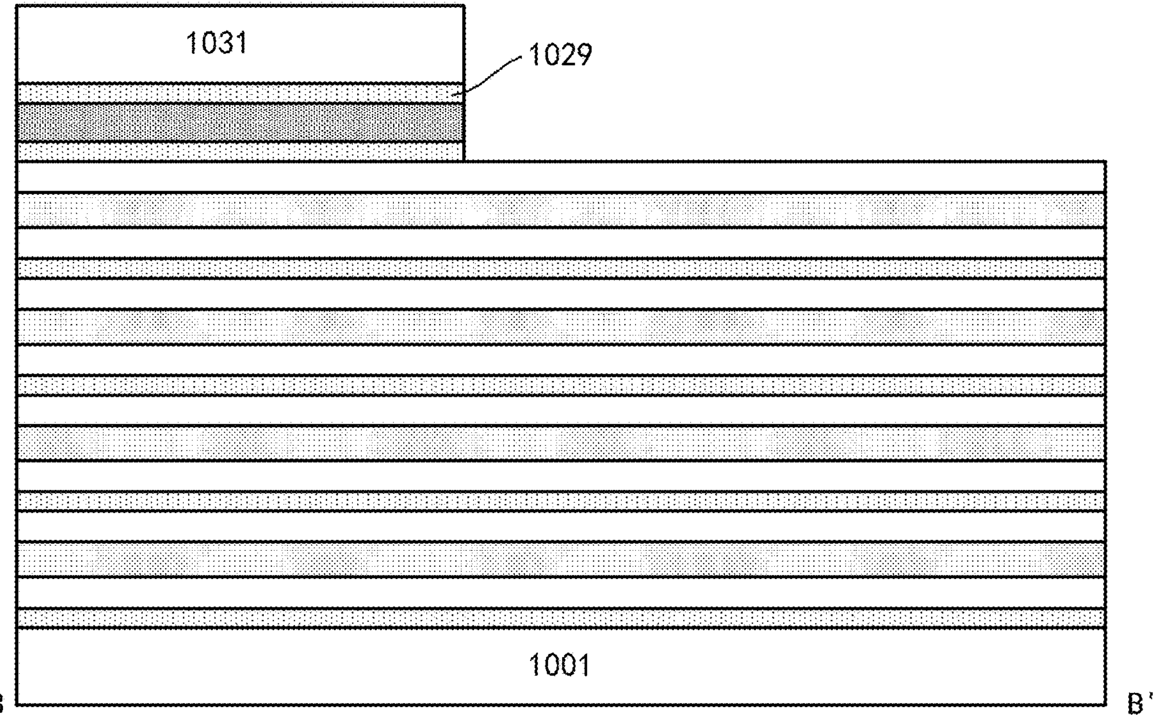

As shown in FIG. 6, the current gate stack is exposed at a surface of the hard mask layer 1015. In order to protect the gate stack (in the device region) when fabricating the step structure as following, another hard mask layer 1029 may be formed on the hard mask layer 1015, as shown in FIGS. 7(*a*), 7(*b*), and 7(*c*). For example, the hard mask layer 1029 may include oxide. A photoresist 1031 may be formed on the hard mask layer 1029. The photoresist 1031 is patterned by photolithography to shield the device region and expose the contact region. Selective etching such as RIE may be performed on the hard mask layer 1029, the hard mask layer 1015, the isolation layer $\mathbf{1023}_5$, and the gate stack by using the photoresist 1031 as an etching mask, so as to expose the device layer. A surface exposed by the photoresist 1031 in the contact region after etching may be substantially planar by controlling an etching depth. For example, the hard mask layer 1029 may be etched and then the gate conductor layer 1027 is etched. The etching of the gate conductor layer 1027 may be stopped near a top surface of the device layer 1005$_4$. Then the hard mask layer 1015 and the isolation layer 1023$_5$ may be etched sequentially. After such etching, a top end of the memory functional layer 1025 may protrude above the top surface of the device layer 1005$_4$ and may be removed by RIE. In this way, a step is formed between the contact region and the device region. Then, the photoresist 1031 may be removed.

Figure 8A:
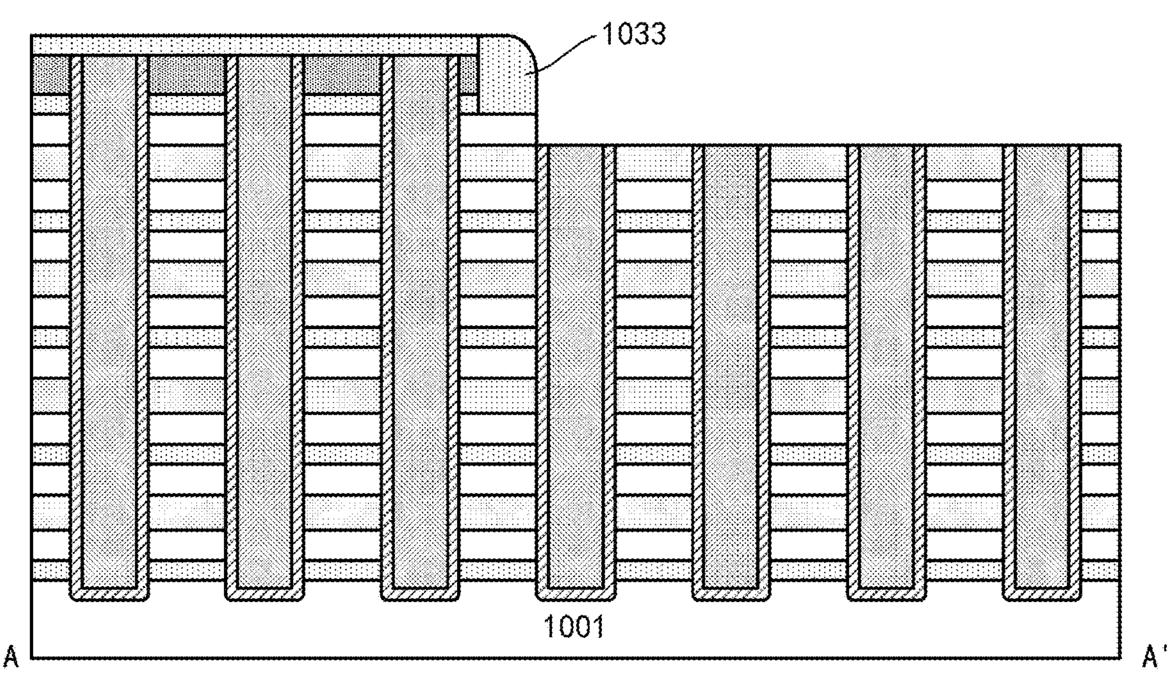
Figure 8B:
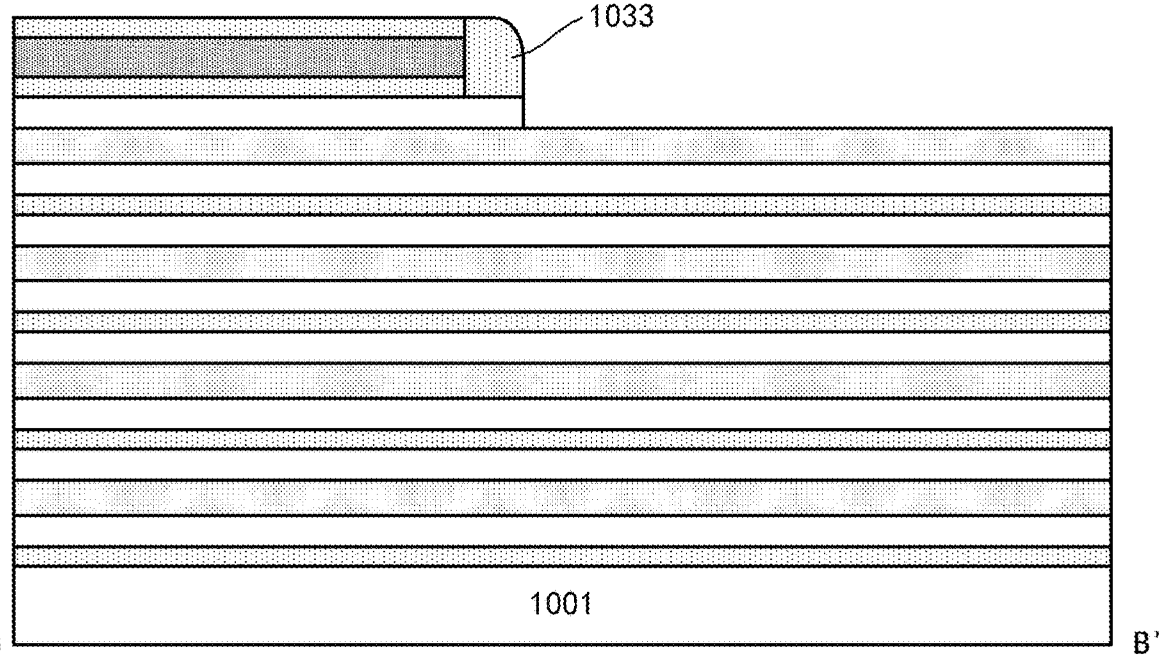

As shown in FIGS. 8(*a*) and 8(*b*), a spacer 1033 may be formed at the step between the contact region and the device region through a spacer formation process. For example, a layer of dielectric such as oxide may be deposited in a substantially conformal manner, and then anisotropic etching such as RIE in the vertical direction may be performed on the deposited dielectric, so as to remove a transverse extending portion of the deposited dielectric and retain a vertical extending portion of the deposited dielectric, thereby forming the spacer 1033. Here, considering that the hard mask layer 1029 also includes oxide, an etching depth of the RIE may be controlled to be substantially equal to or slightly greater than a deposition thickness of the dielectric, so as to avoid completely removing the hard mask layer 1029. A width of the spacer 1033 (in the horizontal direction in FIGS. 8(*a*) and 8(*b*)) may be basically equal to the deposition thickness of the dielectric. The width of the spacer 1033 defines a size of a landing pad of a contact portion to the source/drain region 1009$_4$ in the device layer 1005$_4$.

Selective etching such as RIE may be performed on the exposed source/drain region 1009$_4$ in the device layer 1005$_4$ and gate stack by using the formed spacer 1033 as an etching mask, so as to expose the channel region in the device layer 1005$_4$. A surface exposed by the spacer 1033 in the contact region after etching may be substantially planar by controlling an etching depth. For example, the source/drain region 1009$_4$ and the gate conductor layer 1027 may be etched. For example, the source/drain region 1009$_4$ and the gate conductor layer 1027 are Si and polycrystalline Si respectively; and if the gate conductor layer 1027 includes a metal gate, the source/drain region 1009$_4$ and the gate conductor layer 1027 may be etched separately. The etching of the source/drain region 1009$_4$ and the gate conductor layer 1027 may be stopped at the channel region in the device layer 1005$_4$. After such etching, the top end of the memory functional layer 1025 may protrude above the channel region in the device layer 1005$_4$ and may be removed by RIE. In this way, another step is formed between the source/drain region 1009$_4$ in the device layer 1005$_4$ and the surface exposed by the spacer 1033 in the contact region.

Figure 9A:
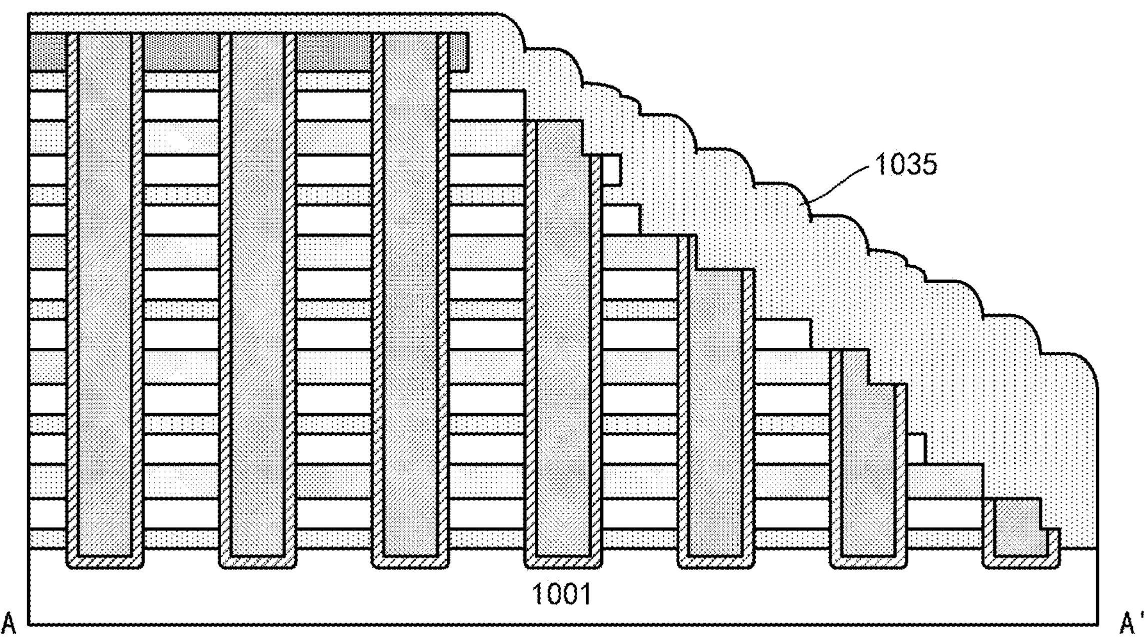
Figure 9B:
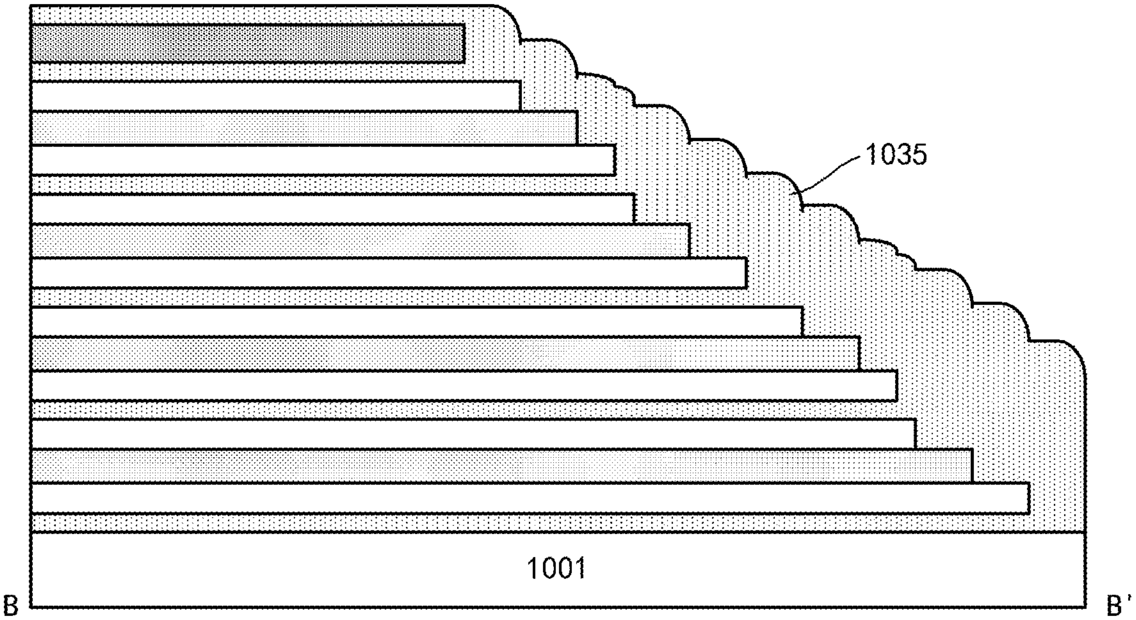

According to the process described above in combination with FIGS. 8(*a*) and 8(*b*), the spacer is formed and etching is performed by taking the spacer as the etching mask. Accordingly, a plurality of steps may be formed in the contact region, as shown in FIGS. 9(*a*) and 9(*b*). Such steps form such a step structure that in each device layer, each of the source/drain regions to be electrically connected and optionally the channel region, has an end portion protruded with respect to the upper region, so as to define a landing pad of a contact portion to the region. A portion of each formed spacer being left after processing is denoted by 1035 in FIGS. 9(*a*) and 9(*b*). Since both the spacer 1035 and the isolation layer are oxide, they are shown here as integral.

Next, the contact portion may be fabricated.

Figure 10A:
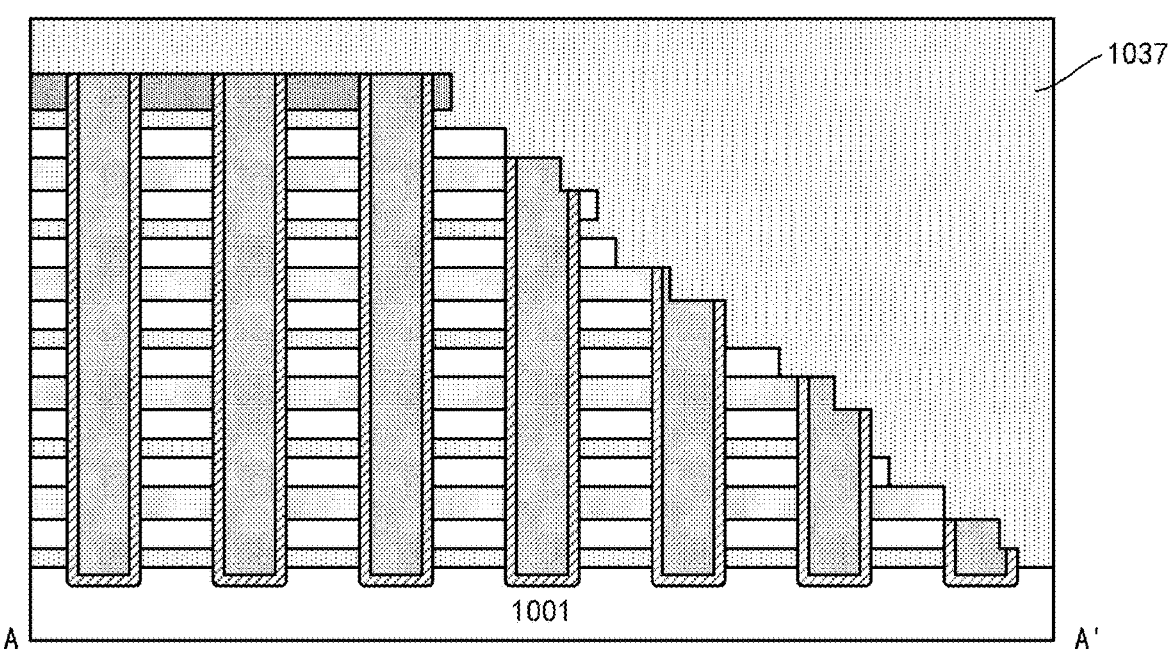
Figure 10B:
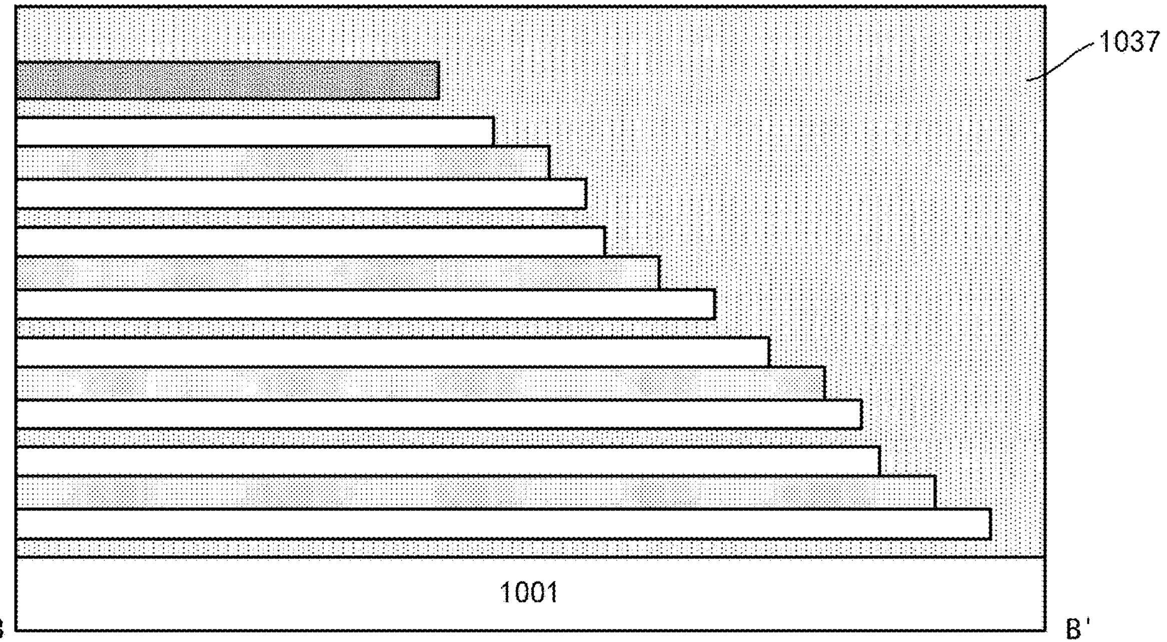
Figure 11A:
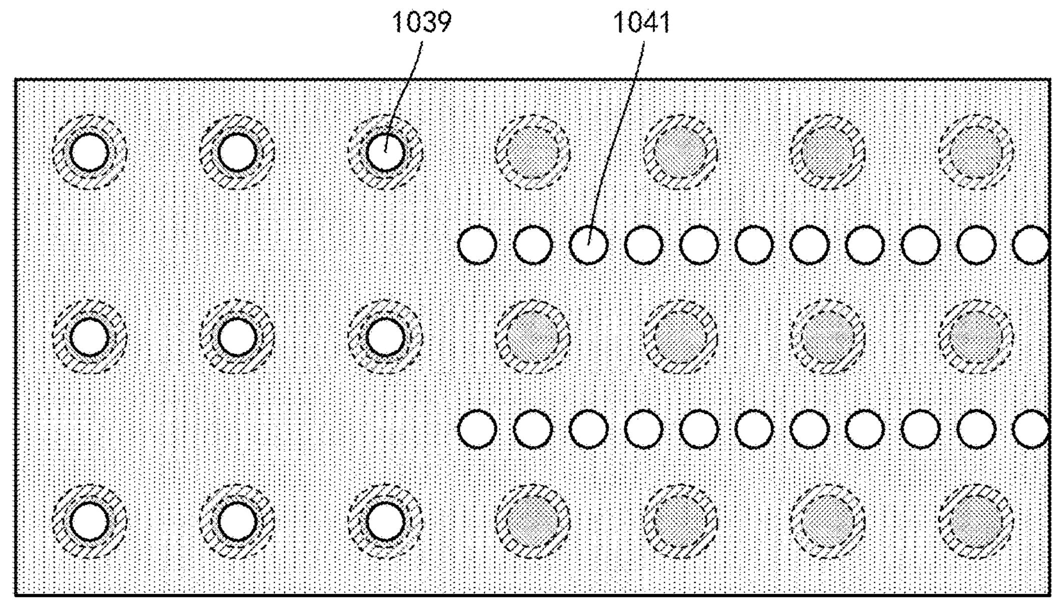
Figure 11B:
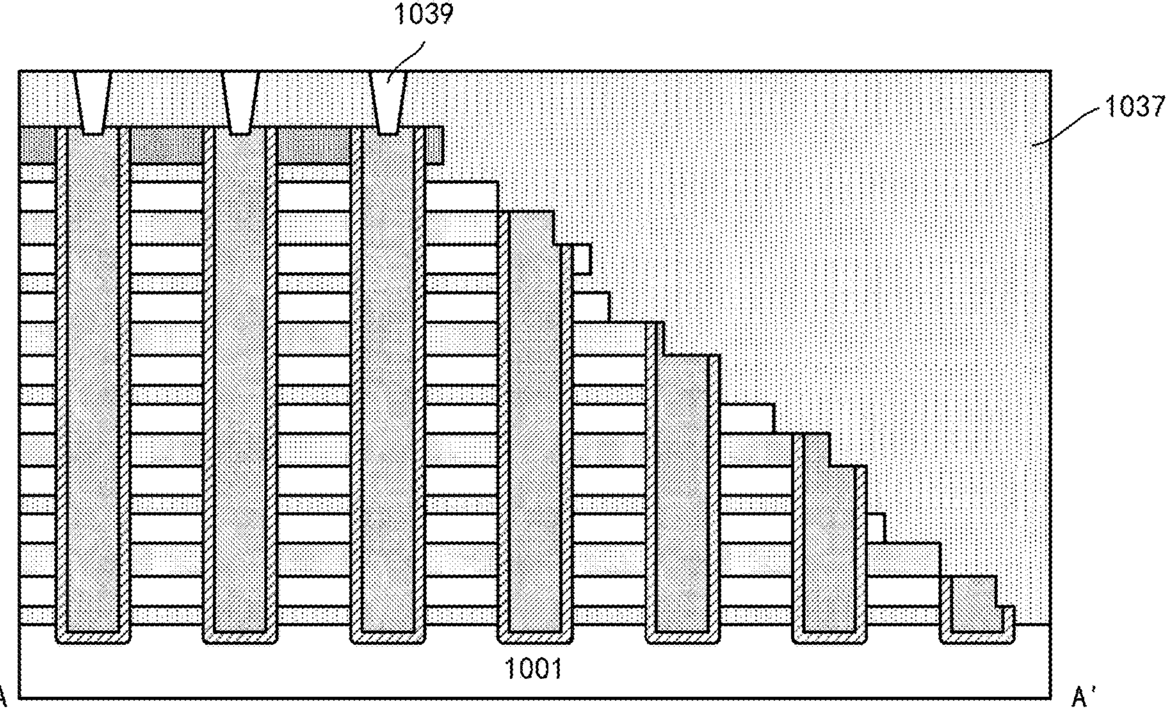
Figure 11C:
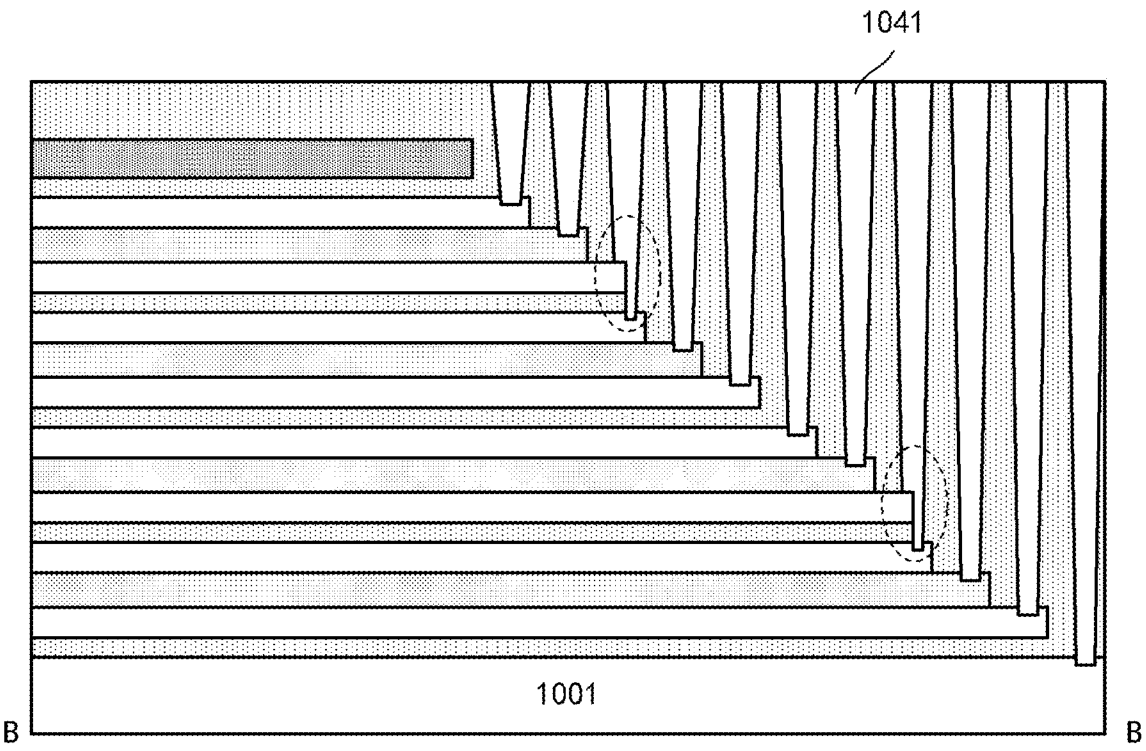

For example, as shown in FIGS. 10(*a*) and 10(*b*), an interlayer dielectric layer 1037 may be formed by depositing oxide and planarization such as CMP. Here, since the previously formed spacer 1035 and isolation layer, and the interlayer dielectric layer 1037 are oxides, they are shown as integral. Then, as shown in FIGS. 11(*a*), 11(*b*), and 11(*c*), contact portions 1039 and 1041 may be formed in the interlayer dielectric layer 1037. Specifically, the contact portion 1039 is formed in the device region and electrically connected to the gate conductor layer 1027 in the gate stack. The contact portion 1041 is formed in the contact region and electrically connected to each source/drain region and optionally the channel region. The contact portion 1041 in the contact region may bypass the gate stack left in the contact region. Such contact portions may be formed by etching the interlayer dielectric layer 1037 to obtain holes and filling the holes with a conductive material such as a metal.

Here, the contact portion 1039 may be electrically connected to a word line. A gate control signal may be applied to the gate conductor layer 1027 through the word line via the contact portion 1039. For every two adjacent memory cells in the vertical direction, source/drain regions located in the middle, i.e. the source/drain region 1009$_1$ in the first device layer 1005$_1$ and the source/drain region 1007$_2$ in the second device layer 1005$_2$, or the source/drain region 1009$_3$ in the third device layer 1005$_3$ and the source/drain region 1007$_4$ in the fourth device layer 1005$_4$, may be electrically connected to a source line via the common contact portion 1041, as shown in dotted circles in FIG. 11(*c*). The source/drain regions located at upper and lower ends, i.e. the source/drain region 1007$_1$ in the first device layer 1005$_1$ and the source/drain region 1009$_2$ in the second device layer 1005$_2$, or the source/drain region 1007$_3$ in the third device layer 1005$_3$ and the source/drain region 1009$_4$ in the fourth device layer 1005$_4$, may be electrically connected to the bit lines via the contact portions 1041 respectively. In this way, a NOR-type configuration may be obtained. Here, a contact portion to the channel layer is also formed. Such contact portion may be called a bulk contact portion and may receive a bulk bias, so as to adjust a threshold voltage of the device.

Here, the two adjacent memory cells in the vertical direction are configured such that the source/drain regions located near in interface between the two adjacent memory cells are electrically connected to the source line. This may save wirings. However, the present disclosure is not limited thereto. For example, adjacent memory cells in the vertical direction may have the same configuration, i.e. a configuration of source region-channel region-drain region, or a configuration of drain region-channel region-source region.

In this embodiment, the isolation layer (used as the solid phase dopant source layer) containing the dopant is reserved. However, the present disclosure is not limited thereto. After diffusion doping, another material may be used to replace the solid phase dopant source layer. For example, the solid phase dopant source layer may be replaced by another dielectric material, especially a dielectric material that does not intentionally contain a dopant, so as to improve the isolation performance. Alternatively, every two device layers adjacent in the vertical direction are taken as a group, and the solid phase dopant source layer between the device layers of each group (for example, the solid phase dopant source layer 1023$_2$ between a group of device layers 1005$_1$ and 1005$_2$, and the solid phase dopant source layer 1023$_4$ between a group of device layers 1005$_3$ and 1005$_4$) may be replaced by a conductive material such as a metal or a doped semiconductor layer, so as to reduce an interconnection resistance (to the source line). Solid phase dopant source layers on upper and lower sides of each group (for example, the solid phase dopant source layer 1023$_1$ on a lower side of the group of device layers 1005$_1$ and 1005$_2$, the solid phase dopant source layer $1023_3$ on an upper side of the group of device layers $1005_1$ and $1005_2$ as well as on a lower side of the group of device layers $1005_3$ and $1005_4$, and the solid phase dopant source layer $1023_5$ on an upper side of the group of device layers $1005_3$ and $1005_4$) may be replaced by a dielectric material, so as to achieve an isolation between bit lines. When the solid phase dopant source layer is replaced, the "interface layer" having the sharp change in doping concentration as described above may also be formed at a side of the source/drain region away from the channel region.

Figure 20:
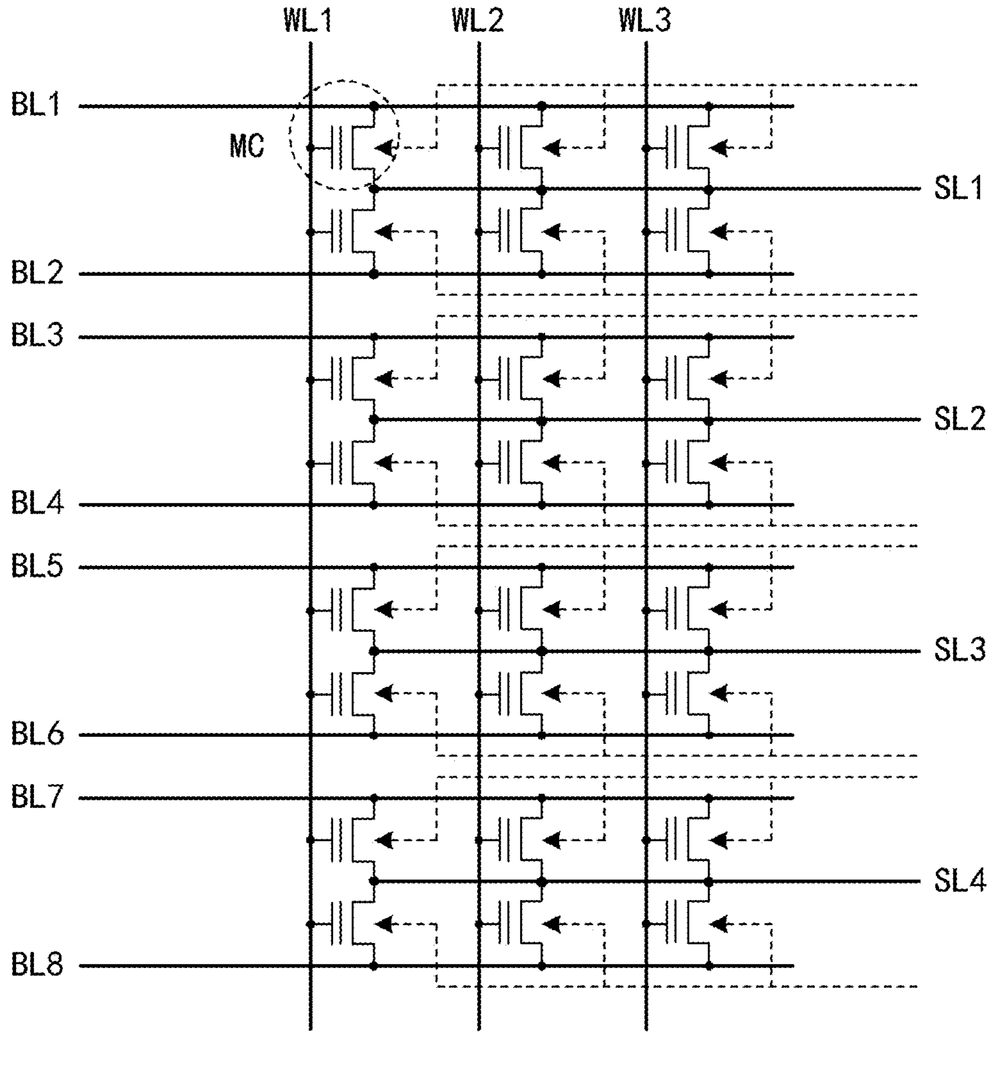
FIG. 20 schematically shows an equivalent circuit diagram of a NOR-type memory device according to an embodiment of the present disclosure, wherein FIGS. 2(*a*), 7(*a*), 11(*a*) and 12(*a*) are top views, and FIG. 2(*a*) shows positions of line AA' and line BB'.

FIG. 20 schematically shows an equivalent circuit diagram of a NOR-type memory device according to an embodiment of the present disclosure.

In an example of FIG. 20, three word lines WL1, WL2, and WL3 and eight bit lines BL1, BL2, BL3, BL4, BL5, BL6, BL7, and BL8 are schematically shown. However, specific numbers of bit lines and word lines are not limited thereto. A memory cell MC is provided at an intersection of the bit line and the word line. FIG. 20 also shows four source lines SL1, SL2, SL3, and SL4. As described above, every two adjacent device layers may share the same source line connection. In addition, respective source lines may be connected to each other, so that respective memory cells MC may be connected to a common source line. In addition, an optional bulk connection to each memory cell is schematically shown in FIG. 20 with dotted lines. As described below, the bulk connection of each memory cell may be electrically connected to a source line connection of the memory cell.

Here, a two-dimensional array of memory cells MC is shown for illustration convenience only. A plurality of such two-dimensional arrays may be arranged in a direction (for example, a direction perpendicular to the paper surface in FIG. 20) of intersection with this two-dimensional array, so as to obtain a three-dimensional array.

In FIG. 20, an extension direction of the word lines WL1 to WL3 may correspond to an extension direction of the gate stack, that is, the vertical direction with respect to the substrate in the above embodiment. In this direction, adjacent bit lines are isolated from each other.

In the above embodiment, the contact portion 1041 in the contact region is desired to bypass the gate stack left in the contact region. According to another embodiment of the present disclosure, an isolation such as the dielectric material may be formed at a top end of the gate stack left in the contact region, so that it is not necessary to deliberately bypass the gate stack left.

Figure 12A:
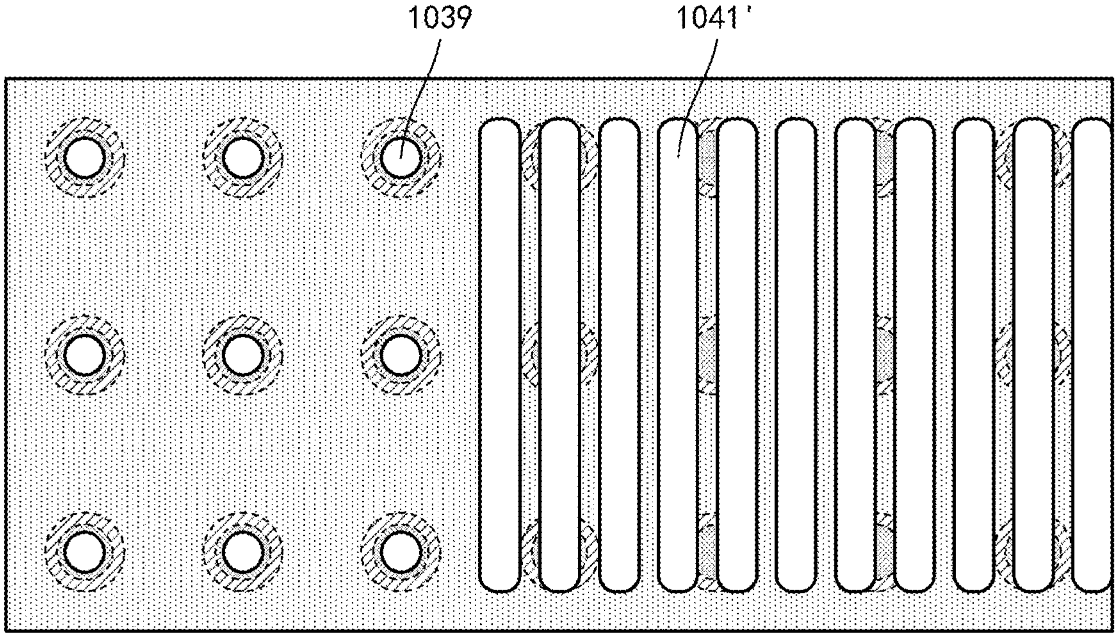
FIGS. 12(*a*) and 12(*b*) are schematic diagrams showing some stages in a process of manufacturing a NOR-type memory device according to another embodiment of the present disclosure.
Figure 12B:
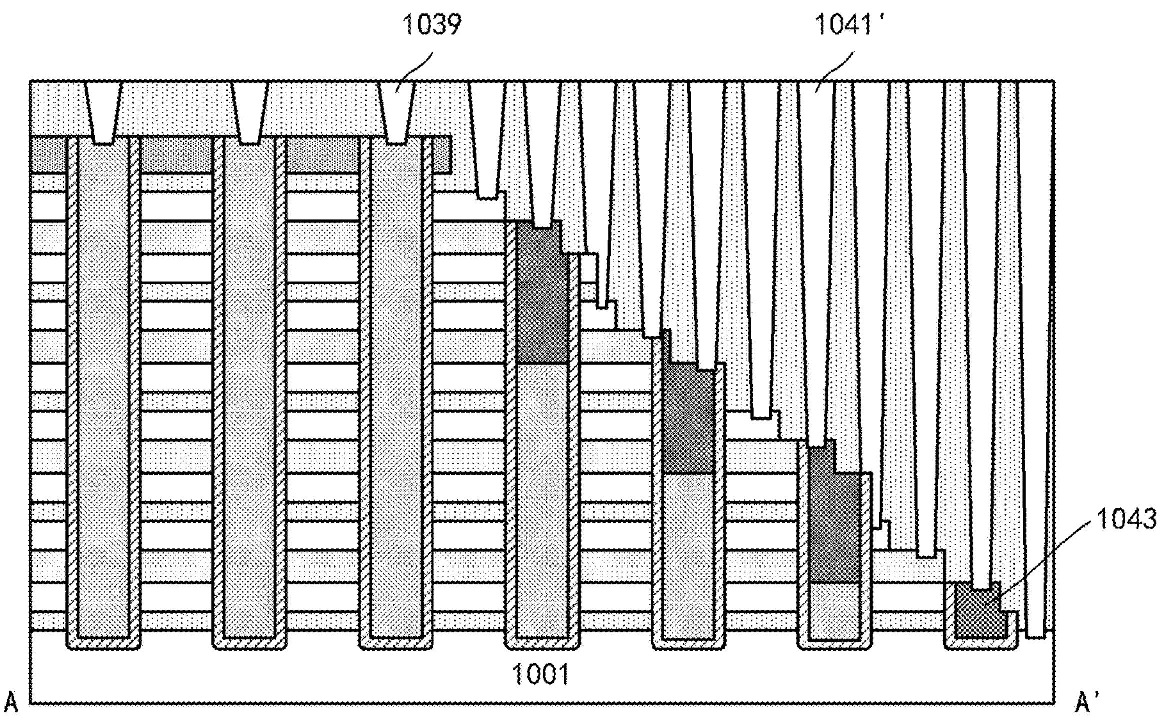
Figure 13:
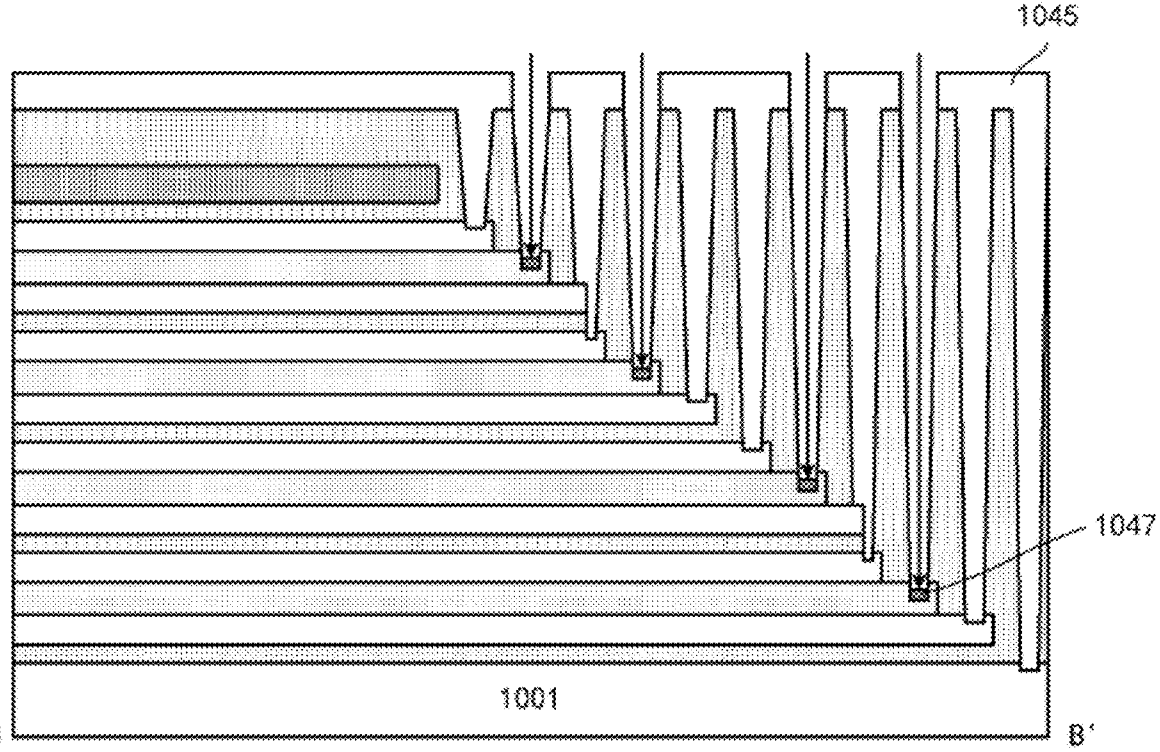
FIG. 13 is a schematic diagram showing some stages in a process of manufacturing a NOR-type memory device according to another embodiment of the present disclosure.

For example, as shown in FIGS. 12(*a*) and 12(*b*), after the step structure is formed in the contact region as described above in combination with FIGS. 7(*a*) to 9(*b*), the isolation layer and the spacer 1035 may be removed by selective etching, such as RIE, so as to expose a top end of each gate stack (in the device region and the contact region). The gate stack in the device region may be shielded by a shielding layer, such as a photoresist, so as to expose the gate stack in the contact region. For the gate stack exposed in the contact region, the gate conductor layer may be recessed by a factor of, for example, about 50 nm to 150 nm, through selective etching such as RIE. After that, the shielding layer may be removed. A gap formed due to the recess of the gate conductor layer in the contact region may be filled with the dielectric material such as SiC by, for example, depositing and then etching back, so as to form an isolation plug 1043.

Next, the interlayer dielectric layer may be formed according to the above embodiment, and contact portions 1039 and 1041' may be formed in the interlayer dielectric layer. In this example, the contact portion 1041' in the contact region may extend into the isolation plug 1043. Therefore, the contact portion 1041' may not be limited to be in form of plug described above, but may be formed into a strip, so as to reduce a contact resistance. The strip contact portion 1041' may extend along a landing pad (i.e., the step in the step structure) of a corresponding layer.

In the above embodiment, since the channel layer is lightly doped or not intentionally doped, a contact resistance between the bulk contact portion and the channel layer may be relatively large. According to another embodiment of the present disclosure, a highly doping (with respect to at least a part of the channel layer) may be formed at a position where the channel layer is in contact with the bulk contact portion, so as to reduce the contact resistance. For example, after the interlayer dielectric layer is formed and the holes for the contact portions are formed in the interlayer dielectric layer by etching as described above, a photoresist 1045 may be formed. The photoresist 1045 is patterned by photolithography to expose holes for bulk contact portions to be formed. A highly doped region 1047 may be formed in a landing pad of the channel layer via these holes by, for example, ion implantation. A doping type of the highly doped region 1047 may be the same as a doping type of the channel layer, but a doping concentration of the highly doped region 1047 is relatively high. Then, the photoresist 1045 may be removed. After that, the contact portions may be formed in the holes of the interlayer dielectric layer.

Figure 14:
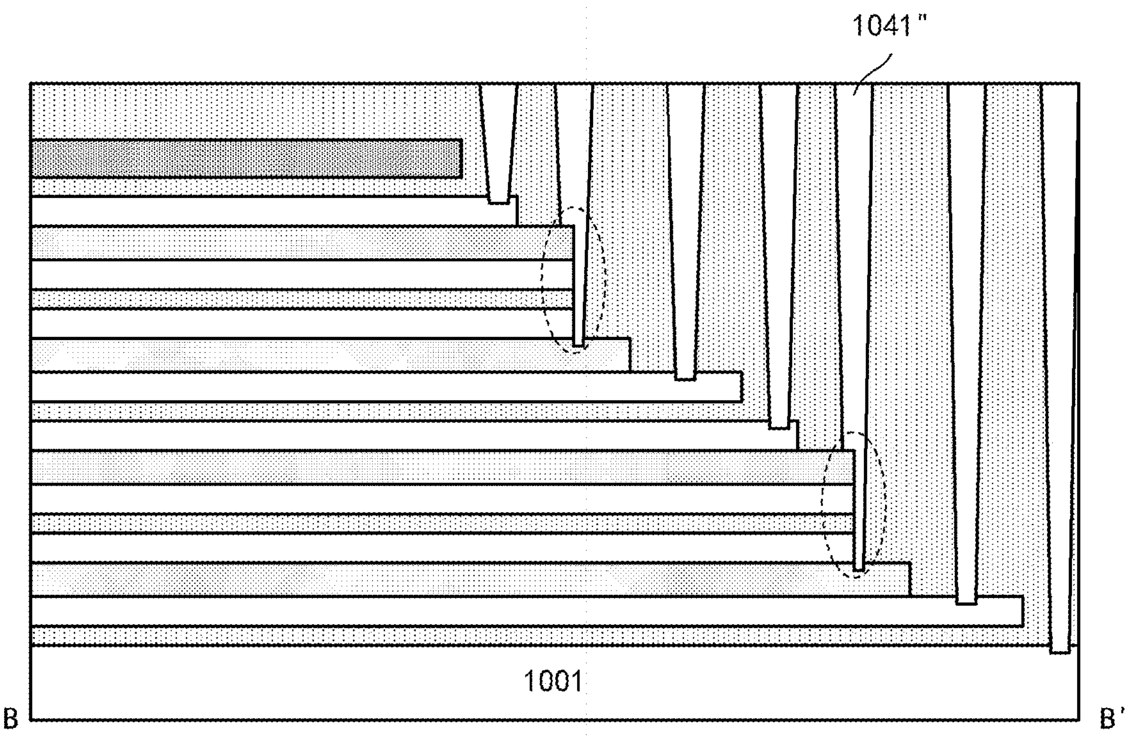
FIG. 14 is a schematic diagram showing some stages in a process of manufacturing a NOR-type memory device according to another embodiment of the present disclosure.

In the above embodiment, the bulk contact portion is provided separately. According to another embodiment of the present disclosure, the bulk contact portion may be integrated with a source line contact portion, so as to save area. For example, as shown in FIG. 14, a contact portion 1041" may be in contact with each channel region of two adjacent device layers and source/drain regions between the channel regions. Instead of forming a step between every adjacent regions in the above embodiment, in the embodiment of FIG. 14, a step may be formed only between the upper three regions and the lower one region of four regions including the channel regions of the two adjacent device layers and the source/drain regions between the channel regions, so as to save area.

In the above embodiment, the contact portion is in direct contact with the corresponding landing pad. According to another embodiment of the present disclosure, silicide may be formed at the landing pad, so as to reduce the contact resistance. More specifically, at each step of the contact region, a transverse surface of the step is used as a landing pad on which silicide may be formed. On the other hand, silicide may not be formed on a vertical surface of the step, so as to avoid a short circuit between landing pads of adjacent steps.

Figure 15:
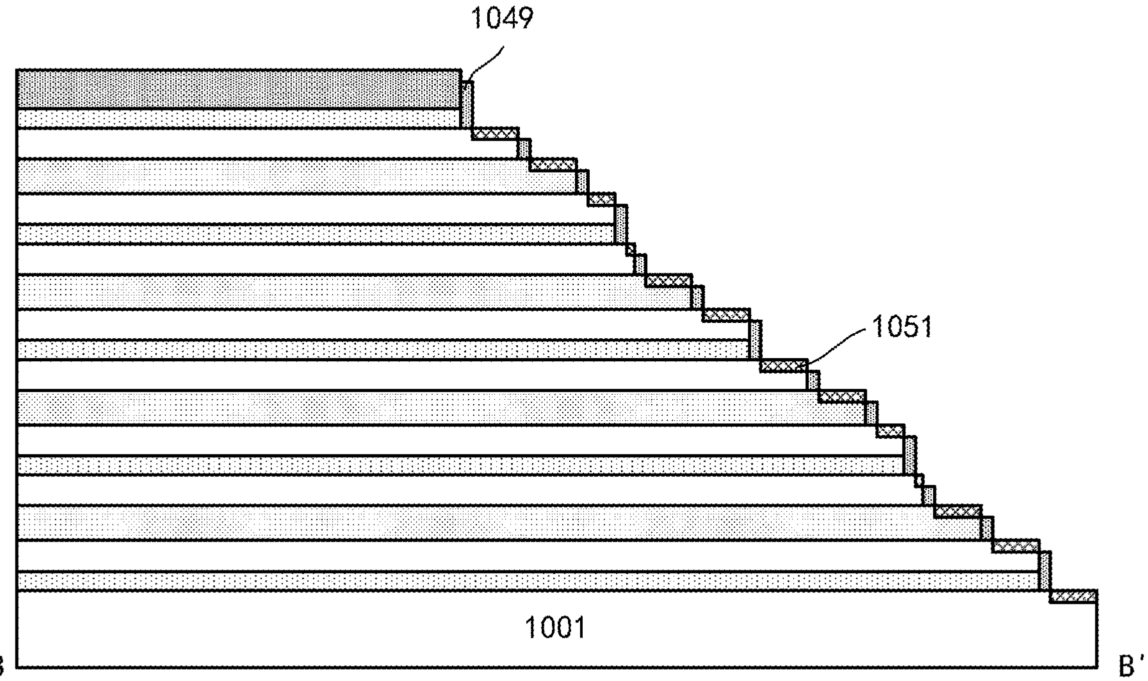
FIG. 15 is a schematic diagram showing some stages in a process of manufacturing a NOR-type memory device according to an embodiment of the present disclosure.

For example, as shown in FIG. 15, after the step structure is formed in the contact region as described above in combination with FIGS. 7(*a*) to 9(*b*), the isolation layer and the spacer 1035 may be removed by selective etching such as RIE, so as to expose a surface of each step in the contact region. A dielectric spacer 1049 may be formed on the vertical surface of each step by the spacer formation process, so as to shield the vertical surface of each step to avoid a subsequent silicification reaction. Then, an exposed transverse surface of each step may be silicified. For example, a metal such as NiPt may be deposited and annealed, so that silicification reaction is conducted between the deposited metal and a semiconductor material (such as Si) at the transverse surface of each step, so as to generate a conductive metal silicide 1051 such as NiPtSi. An unreacted metal may then be removed.

In the example as shown, the gate conductor layer 1027 is polysilicon for example. Accordingly, a top end of the gate conductor layer 1027 may also undergo the silicification reaction and thus be covered by silicide. When the gate conductor layer 1027 is the metal gate, a protective layer (for example, nitride) may be formed on the device region to cover the gate stack and then be silicified. Accordingly, the gate conductor layer 1027 may be prevented from damaged by etching when removing the metal in the silicification process.

Next, the interlayer dielectric layer may be formed as described above, and the contact portions 1039 and 1041 may be formed in the interlayer dielectric layer. When etching the hole used for the contact portion, the silicide 1051 may be used as an etching stop layer. Therefore, an etching depth of the hole may be better controlled.

In the above embodiment, the active region is defined by the device layers, acting as the bulk material, and thus the channel region is formed in the bulk material. In this case, the process is relatively simple. However, the present disclosure is not limited thereto.

After the isolation layers 1023$_1$ to 1023$_5$ are formed and the support layer 1019 is removed as described above in combination with FIG. 5, the sidewalls of respective device layers are exposed in the processing channel T. Another semiconductor layer may be formed on these sidewalls by, for example, epitaxial growth. The channel region may be formed in the formed semiconductor layer (here, each device layer may be called a "base layer", and each base layer and a semiconductor layer on a sidewall of the base layer may be collectively called a "device layer", because they define a device hierarchy collectively). The semiconductor layer may be formed along the sidewall of the processing channel T, so that the semiconductor layer has a shape of annular nanosheet. The device performance may be improved by selecting characteristics such as material and/or thickness of the semiconductor layer.

Figure 16:
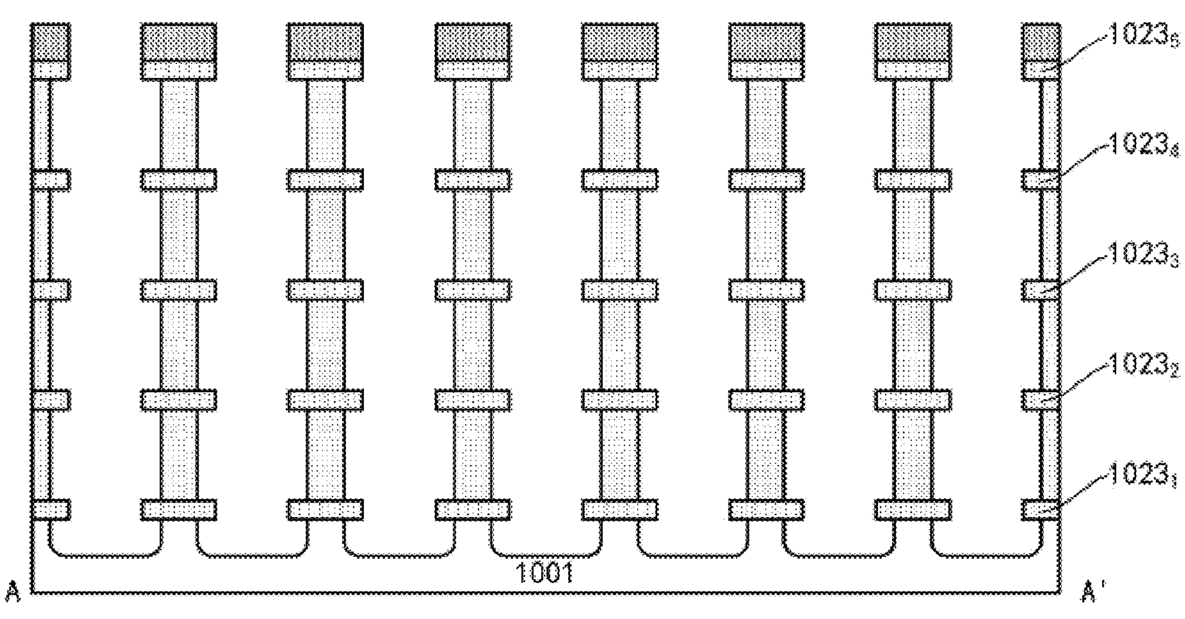
FIGS. 16 to 19 are schematic diagrams showing some stages in a process of manufacturing a NOR-type memory device according to an embodiment of the present disclosure.

In order to ensure the isolation between the semiconductor layers grown on the sidewalls of respective device layers, such semiconductor layer may be formed between isolation layers. To this end, as shown in FIG. 16, each device layer 1005$_1$ to 1005$_4$ may be recessed to a certain extent in the transverse direction by selective etching. Each device layer 1005$_1$ to 1005$_4$ may be recessed to substantially the same depth in each transverse direction, and thus may result in an annular gap centered on the processing channel T between each pair of adjacent isolation layers in the vertical direction. The sidewalls of respective device layers may still be substantially coplanar in the vertical direction after etching.

Figure 17:
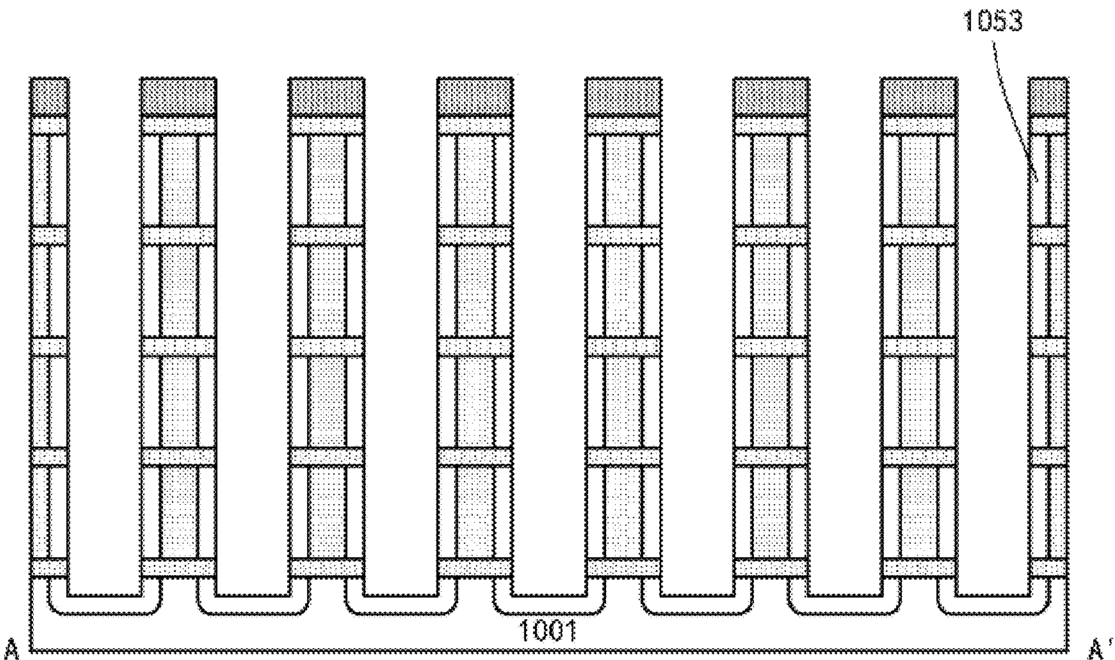

Next, as shown in FIG. 17, another semiconductor layer 1053 may be respectively formed on an exposed surface of each of the device layers 1005$_1$ to 1005$_4$, for example, by selective epitaxial growth. The above-mentioned annular gap may be filled with the semiconductor layer 1053. The semiconductor layer 1053 may include various suitable semiconductor materials such as Si. A material and/or thickness of the semiconductor layer 1053 may be selected to improve the device performance. For example, the semiconductor layer 1053 may include a material different from the material of the device layer (all the device layers are made of Si in this example), such as Ge, IV-IV compound semiconductor such as SiGe, III-V compound semiconductor, etc., to improve the carrier mobility or reduce the leakage current. Adjacent semiconductor layers 1053 in the vertical direction may be isolated from each other by the isolation layer.

Figure 18:
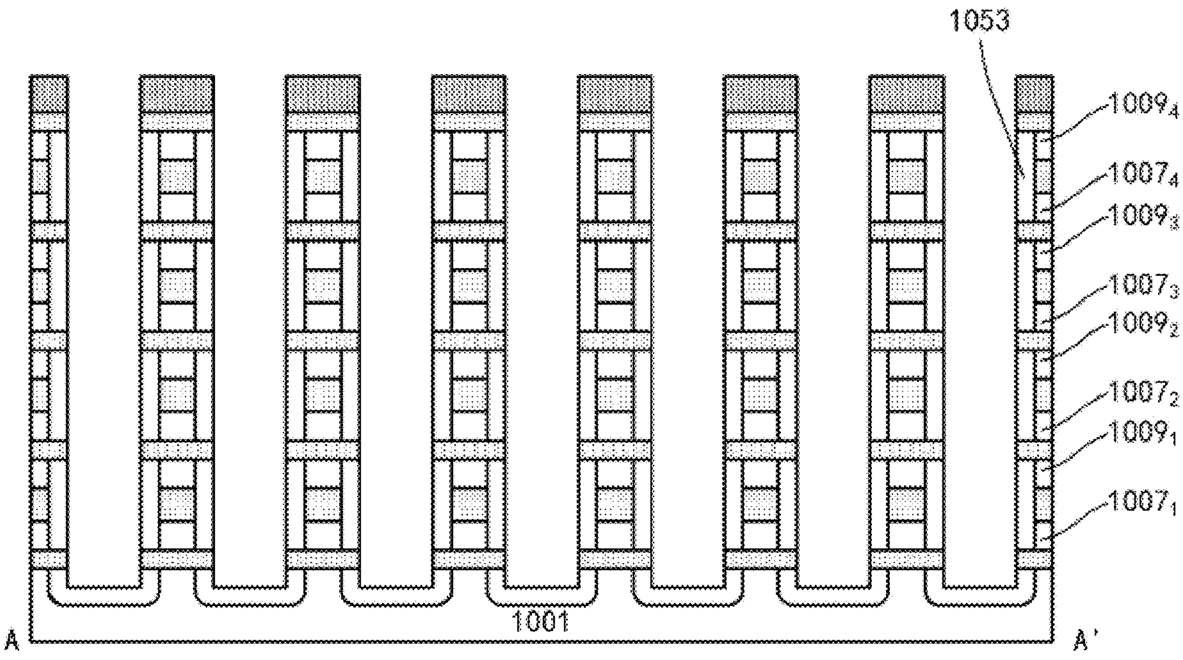

Next, as shown in FIG. 18, the annealing treatment may be performed to drive the dopants in the isolation layers 1023$_1$ to 1023$_5$ into the semiconductor layer 1053, so as to form source/drain doping at the upper and lower ends of the semiconductor layer 1053. Regarding the source/drain doping, reference may be made to the above description in combination with FIG. 6.

According to another embodiment, the SSRW may further be formed. For example, the dopant in each of the device layers 1005$_1$ to 1005$_4$ may also diffuse transversely into a semiconductor layer 1053 adjacent to the each of the device layers 1005$_1$ to 1005$_4$ during the annealing treatment. As described above, in the vertical direction, the dopants from the isolation layers 1023$_1$ to 1023$_5$ do not substantially affect a middle portion of the semiconductor layer 1053 due to the diffusion depth. Therefore, a doping distribution in the middle portion of the semiconductor layer 1053 mainly depends on the transverse diffusion from each of the device layers 1005$_1$ to 1005$_4$, and the channel region may be defined. A processing condition such as an annealing time of the annealing treatment may be controlled so that in the middle portion of the semiconductor layer 1053, a doping concentration at a sidewall (and its vicinity) of the semiconductor layer 1053 away from the corresponding device layer in the transverse direction is less than a doping concentration at a sidewall (and its vicinity) adjacent to the corresponding device layer. Accordingly, the SSRW may be formed, and good control of the short channel effect may be obtained.

Figure 19:
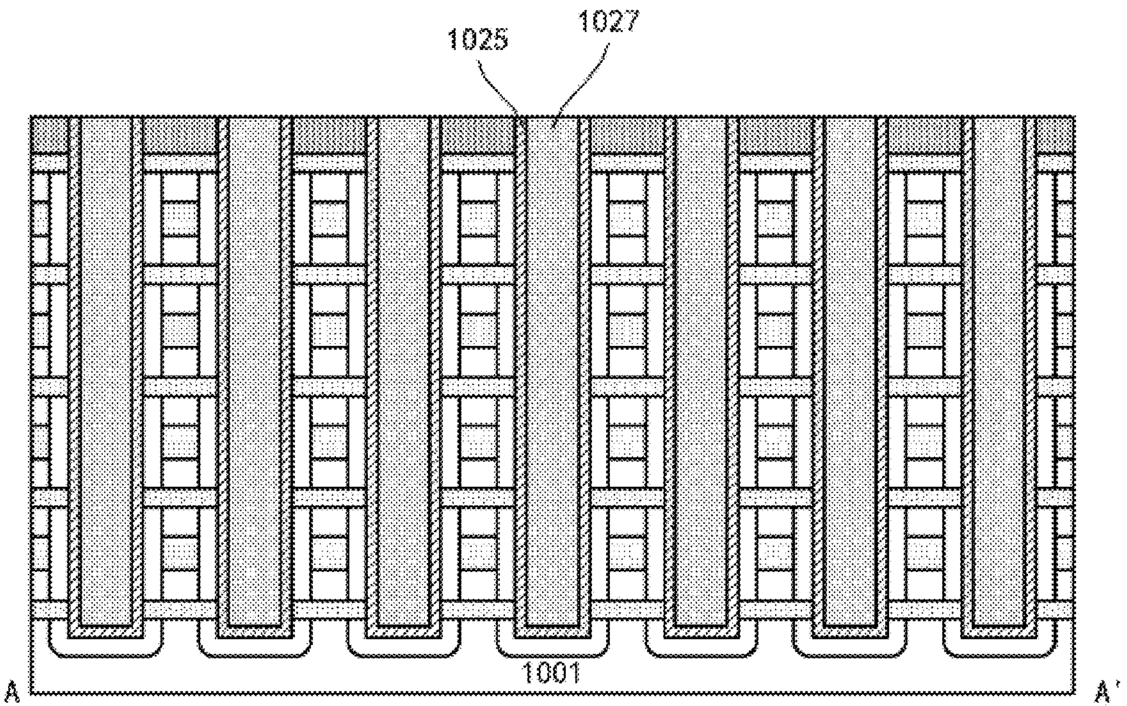

Next, as shown in FIG. 19, the gate stack may be formed in the processing channel, and the subsequent process may be performed as described above. It should be pointed out here that in this example, annealing treatment is performed before the formation of the gate stack. Alternatively, as described above in combination with FIG. 6, the annealing treatment may be performed after the formation of the gate stack.

The memory device according to the embodiments of the present disclosure may be applied to various electronic apparatuses. For example, the memory device may store various programs, applications and data required for an operation of the electronic apparatus. The electronic apparatus may further include a processor cooperated with the memory device. For example, the processor may operate the electronic apparatus by running a program stored in the memory device. Such electronic apparatus includes, for example, a smart phone, a personal computer (PC), a tablet, an artificial intelligence device, a wearable device, or a mobile power supply, etc.

In the above description, the technical details such as patterning and etching of each layer are not described in detail. However, those skilled in the art should understand that various technical means may be employed to form a layer, a region, or the like having a desired shape. In addition, in order to form the same structure, those skilled in the art may also design a method that is not completely the same as the method described above. In addition, although the respective embodiments are described above separately, this does not mean that the measures in the respective embodiments cannot be advantageously used in combination.

The embodiments of the present disclosure have been described above. However, these examples are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should fall within the scope of the present disclosure.

What is claimed is:

1. A NOR-type memory device, comprising:

a plurality of device layers stacked on a substrate, wherein each of the plurality of device layers comprises a first source/drain region and a second source/drain region at opposite ends of the device layer in a vertical direction, and a channel region between the first source/drain region and the second source/drain region in the vertical direction; and a gate stack that extends vertically with respect to the substrate to pass through each of the plurality of device layers, wherein the gate stack comprises a gate conductor layer and a memory functional layer disposed between the gate conductor layer and the device layer, and a memory cell is defined at an intersection of the gate stack and the device layer, wherein a doping concentration in the first source/drain region decreases towards the channel region in the vertical direction, and a doping concentration in the second source/drain region decreases towards the channel region in the vertical direction, wherein the NOR-type memory device further comprises a plurality of isolation layers disposed alternately with the device layers, so that each device layer is located between isolation layers in the vertical direction, and wherein the isolation layer contains a dopant identical to a dopant in each of the first source/drain region and the second source/drain region.

2. The NOR-type memory device according to claim 1, further comprising:

an interface layer on a side of the first source/drain region away from the channel region and an interface layer on a side of the second source/drain region away from the channel region.

3. The NOR-type memory device according to claim 1, wherein the highest doping concentration in the first source/drain region is higher than 1E20 $cm^{-3}$, and the highest doping concentration in the second source/drain region is higher than 1E20 $cm^{-3}$.

4. The NOR-type memory device according to claim 1, wherein the device layer comprises:

a base layer; and a semiconductor layer on a sidewall of the base layer facing the gate stack, wherein the channel region is substantially formed in the semiconductor layer.

5. The NOR-type memory device according to claim 4, wherein the semiconductor layer comprises a single crystal semiconductor material.

6. The NOR-type memory device according to claim 4, wherein the semiconductor layer comprises a semiconductor material different from the base layer.

7. The NOR-type memory device according to claim 4, wherein each of the semiconductor layer and the base layer has a first doped region and a second doped region, wherein the first doped region of the semiconductor layer is substantially coplanar to the first doped region of the base layer in a transverse direction, and the second doped region of the semiconductor layer is substantially coplanar to the second doped region of the base layer in the transverse direction, wherein the first doped regions define the first source/drain region, and the second doped regions define the second source/drain region.

8. The NOR-type memory device according to claim 4, wherein the channel region comprises a dopant, wherein a conductive type of the dopant in the channel region is opposite to a conductive type of a dopant in each of the source/drain regions, and a doping concentration of the channel region on a side of the channel region close to the gate stack is lower than a doping concentration of the channel region on a side of the channel region away from the gate stack.

9. The NOR-type memory device according to claim 1, wherein the memory functional layer comprises at least one of a charge trapping material or a ferroelectric material.

10. The NOR-type memory device according to claim 1, wherein the device layer comprises a single crystal semiconductor material.

11. The NOR-type memory device according to claim 1, wherein the channel region comprises a dopant, wherein a conductive type of the dopant in the channel region is opposite to a conductive type of a dopant in each of the first source/drain region and the second source/drain region.

12. The NOR-type memory device according to claim 1, further comprising:

a first bit line;

a source line;

a first contact portion to the first source/drain region; and a second contact portion to the second source/drain region;

wherein the first contact portion is electrically connected to the first bit line, and the second contact portion is electrically connected to the source line.

13. The NOR-type memory device according to claim 12, wherein the channel region has a non-uniform doping distribution in the vertical direction, wherein a portion of the channel region close to the first source/drain region has a relatively high doping concentration, and a portion of the channel region close to the second source/drain region has a relatively low doping concentration.

14. The NOR-type memory device according to claim 12, further comprising:

a second bit line different from the first bit line; and a third contact portion to a first source/drain region of a further device layer adjacent to the device layer in the vertical direction, wherein the third contact portion is electrically connected to the second bit line, and a second source/drain region of the further device layer is electrically connected to the source line via the second contact portion, and wherein the device layer and the further device layer are disposed so that the second source/drain region of the device layer is adjacent to the second source/drain region of the further device layer.

15. The NOR-type memory device according to claim 14, further comprising:

a conductive layer between the device layer and the further device layer; and an isolation layer located on a further side of the device layer opposite to the further device layer and an isolation layer located on a further side of the further device layer opposite to the device layer.

16. The NOR-type memory device according to claim 14, further comprising:

a fourth contact portion to the channel region of the device layer; and a fifth contact portion to a channel region of the further device layer.

17. The NOR-type memory device according to claim 16, wherein the first contact portion, the second contact portion, the third contact portion, the fourth contact portion, and the fifth contact portion are formed as strips extending substantially parallel to each other.

18. The NOR-type memory device according to claim 16, further comprising:

a highly doped region that is located in the channel region of the device layer in contact with the fourth contact portion and has a doping concentration higher than a doping concentration of at least a part of the rest of the channel region of the device layer; and a highly doped region that is located in the channel region of the further device layer in contact with the fifth contact portion and has a doping concentration higher than a doping concentration of at least a part of the rest of the channel region of the further device layer.

19. The NOR-type memory device according to claim 14, wherein the third contact portion is further electrically connected to the channel region of the device layer and the channel region of the further device layer.

20. The NOR-type memory device according to claim 12, wherein the substrate comprises a device region and a contact region adjacent to the device region, the memory cell is formed on the device region, and the contact portions are formed on the contact region.

21. The NOR-type memory device according to claim 20, wherein the plurality of device layers form a step structure in the contact region, the step structure comprises a step with a transverse surface and a vertical surface, and the NOR-type memory device further comprises:

a silicide on the transverse surface of the step; and a dielectric spacer on the vertical surface of the step.

22. The NOR-type memory device according to claim 1, further comprising:

a word line; and a sixth contact portion to the gate conductor layer, wherein the sixth contact portion is electrically connected to the word line.

23. An electronic apparatus comprising the NOR-type memory device according to claim 1.

24. The electronic apparatus according to claim 23, wherein the electronic apparatus comprises a smart phone, a computer, a tablet, an artificial intelligence device, a wearable device, or a mobile power supply.

25. A NOR-type memory device, comprising:

a plurality of device layers stacked on a substrate, wherein each of the plurality of device layers comprises a first source/drain region and a second source/drain region at opposite ends of the device layer in a vertical direction, and a channel region between the first source/drain region and the second source/drain region in the vertical direction; and a gate stack that extends vertically with respect to the substrate to pass through each of the plurality of device layers, wherein the gate stack comprises a gate conductor layer and a memory functional layer disposed between the gate conductor layer and the device layer, and a memory cell is defined at an intersection of the gate stack and the device layer, wherein the NOR-type memory device further comprises an interface layer between the first source/drain region and the channel region, and an interface layer between the second source/drain region and the channel region, wherein the NOR-type memory device further comprises a plurality of isolation layers disposed alternately with the device layers, so that each device layer is located between isolation layers in the vertical direction, wherein the isolation layer contains a dopant identical to a dopant in each of the first source/drain region and the second source/drain region.

26. The NOR-type memory device according to claim 25, wherein a concentration of the dopant in the isolation layer is equal to or higher than a doping concentration in the first source/drain region and a doping concentration in the second source/drain region.

27. A method of manufacturing a NOR-type memory device, comprising:

alternately disposing a plurality of device layers and a plurality of solid phase dopant source layers on a substrate, so that each of the plurality of device layers is located between the solid phase dopant source layers in a vertical direction, wherein the solid phase dopant source layer contains a dopant;

forming a processing channel that extends vertically with respect to the substrate to pass through each of the plurality of device layers;

driving the dopant from the solid phase dopant source layer into opposite ends of the device layer by annealing; and forming a gate stack in the processing channel, wherein the gate stack comprises a gate conductor layer and a memory functional layer disposed between the gate conductor layer and the device layer, and a memory cell is defined at an intersection of the gate stack and the device layer.

28. The method according to claim 27, further comprising:

selectively etching the device layer through the processing channel, so that the device layer is recessed with respect to the isolation layer in a transverse direction; and epitaxially growing a semiconductor layer on a sidewall of the device layer exposed in the processing channel, wherein the semiconductor layer is located between the isolation layers.

29. The method according to claim 28, wherein the annealing causes a dopant in the device layer to diffuse transversely into the semiconductor layer.

30. The method according to claim 29, wherein the transverse diffusion causes a non-uniform doping distribution in a middle portion of the semiconductor layer: a doping concentration of the semiconductor layer on a side of the semiconductor layer close to the device layer is higher than a doping concentration of the semiconductor layer on a side of the semiconductor layer away from the device layer.

31. The method according to claim 27, wherein disposing the plurality of device layers and the plurality of solid phase dopant source layers comprises: alternately forming the plurality of device layers and a plurality of sacrificial layers on the substrate by epitaxial growth, and wherein the method further comprises: replacing the plurality of sacrificial layers by the plurality of solid phase dopant source layers via the processing channel.

32. The method according to claim 31, wherein replacing the sacrificial layer by the solid phase dopant source layer comprises:

forming a support layer in one or more of processing channels, so that the sacrificial layer is exposed in the rest of the processing channels;

replacing the sacrificial layer by the solid phase dopant source layer via the processing channel; and removing the support layer.

33. The method according to claim 31, wherein the plurality of device layers are doped in situ during epitaxial growth.

34. The method according to claim 27, wherein forming the gate stack comprises:

forming the memory functional layer on a bottom surface of the processing channel and a sidewall of the processing channel in a substantially conformal manner; and filling the processing channel, on which the memory functional layer is formed, with the gate conductor layer.

35. The method according to claim 27, wherein a plurality of processing channels arranged in an array is formed.

36. The method according to claim 27, wherein the substrate comprises a device region and a contact region adjacent to the device region, the memory cell is formed on the device region, source/drain regions are formed at opposite ends of each device layer or each semiconductor layer in the vertical direction by the annealing, and each device layer or each semiconductor layer further comprises a channel region located between the source/drain regions in the vertical direction, and the method further comprises:

forming, on the contact region, a first contact portion to a first source/drain region among the source/drain regions at the opposite ends of the device layer and a second contact portion to a second source/drain region among the source/drain regions at the opposite ends of the device layer; and electrically connecting the first contact portion to a first bit line, and electrically connecting the second contact portion to a source line.

37. The method according to claim 36, wherein the device layer has a non-uniform doping distribution in the vertical direction in the channel region, wherein a portion of the channel region close to the first source/drain region has a relatively high doping concentration, and a portion of the channel region close to the second source/drain region has a relatively low doping concentration.

38. The method according to claim 36, further comprising:

forming, on the contact region, a third contact portion to a first source/drain region among source/drain regions at opposite ends of a further device layer adjacent to the device layer in the vertical direction;

electrically connecting the third contact portion to a second bit line different from the first bit line, and electrically connecting a second source/drain region among the source/drain regions at the opposite ends of the further device layer to the source line via the second contact portion, wherein the device layer and the further device layer are disposed so that the second source/drain region of the device layer is adjacent to the second source/drain region of the further device layer.

39. The method according to claim 38, further comprising:

forming, on the contact region, a fourth contact portion to the channel region of the device layer and a fifth contact portion to the channel region of the further device region.

40. The method according to claim 39, wherein the first contact portion, the second contact portion, the third contact portion, the fourth contact portion, and the fifth contact portion are formed as strips extending substantially parallel to each other.

41. The method according to claim 39, further comprising:

forming, at a place where the channel region of the device layer is in contact with the fourth contact portion, a highly doped region having a doping concentration higher than a doping concentration of at least a part of the rest of the channel region of the device layer; and forming, at a place where the channel region of the further device layer is in contact with the fifth contact portion, a highly doped region having a doping concentration higher than a doping concentration of at least a part of the rest of the channel region of the further device layer.

42. The method according to claim 38, wherein the third contact portion is further formed to be electrically connected to the channel region of the device layer and the channel region of the further device layer.

43. The method according to claim 36, further comprising:

patterning the plurality of device layers into a step structure in the contact region.

44. The method according to claim 43, wherein the step structure comprises a step with a transverse surface and a vertical surface, and the method further comprises:

forming a dielectric spacer on the vertical surface of the step; and siliconizing the transverse surface of the step.

* * * * *